(12) United States Patent
Kobayashi

(10) Patent No.: US 6,492,683 B2
(45) Date of Patent: Dec. 10, 2002

(54) SEMICONDUCTOR DEVICE WITH SOI STRUCTURE AND METHOD OF MANUFACTURING THE SAME

(75) Inventor: Kenya Kobayashi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/966,035

(22) Filed: Sep. 27, 2001

(65) Prior Publication Data

US 2002/0036330 A1 Mar. 28, 2002

(30) Foreign Application Priority Data

Sep. 28, 2000 (JP) ........................... 2000/297308

(51) Int. Cl.[7] .................. H01L 27/01; H01L 27/12; H01L 31/0392
(52) U.S. Cl. .................. 257/347; 257/774; 257/368
(58) Field of Search .................. 257/347, 737, 257/738, 774, 778, 779, 780, 368; 438/149, 479, 517

(56) References Cited

U.S. PATENT DOCUMENTS 6,281,054 B1 * 8/2001 Yeo ........................ 257/347

FOREIGN PATENT DOCUMENTS

| JP | H2-54554 | 2/1990 |
| JP | H6-244239 | 9/1994 |
| JP | H8-153781 | 6/1996 |
| JP | H8-236754 | 9/1996 |
| JP | 2654268 | 5/1997 |
| JP | H11-135794 | 5/1999 |
| JP | 2000-31266 | 1/2000 |

* cited by examiner

Primary Examiner—Tom Thomas
Assistant Examiner—Thien F. Tran
(74) Attorney, Agent, or Firm—Scully, Scott, Murphy & Presser

(57) ABSTRACT

A semiconductor device includes a conductive semiconductor substrate laminated or bonded on a conductive support substrate through a first insulating film, a separation trench which separates a device formation region where at least a desired element is formed, from a region of the semiconductor substrate, a separation trench, and a substrate contact region where the semiconductor substrate is not present. The semiconductor device further includes a second insulating film which fills the separation trench and covers a surface of the substrate contact region, an external connection electrode formed above the semiconductor substrate, and a support substrate connecting section which passes through the first insulating film and the second insulating film in the substrate contact region to connect the external connection electrode and the support substrate.

10 Claims, 48 Drawing Sheets

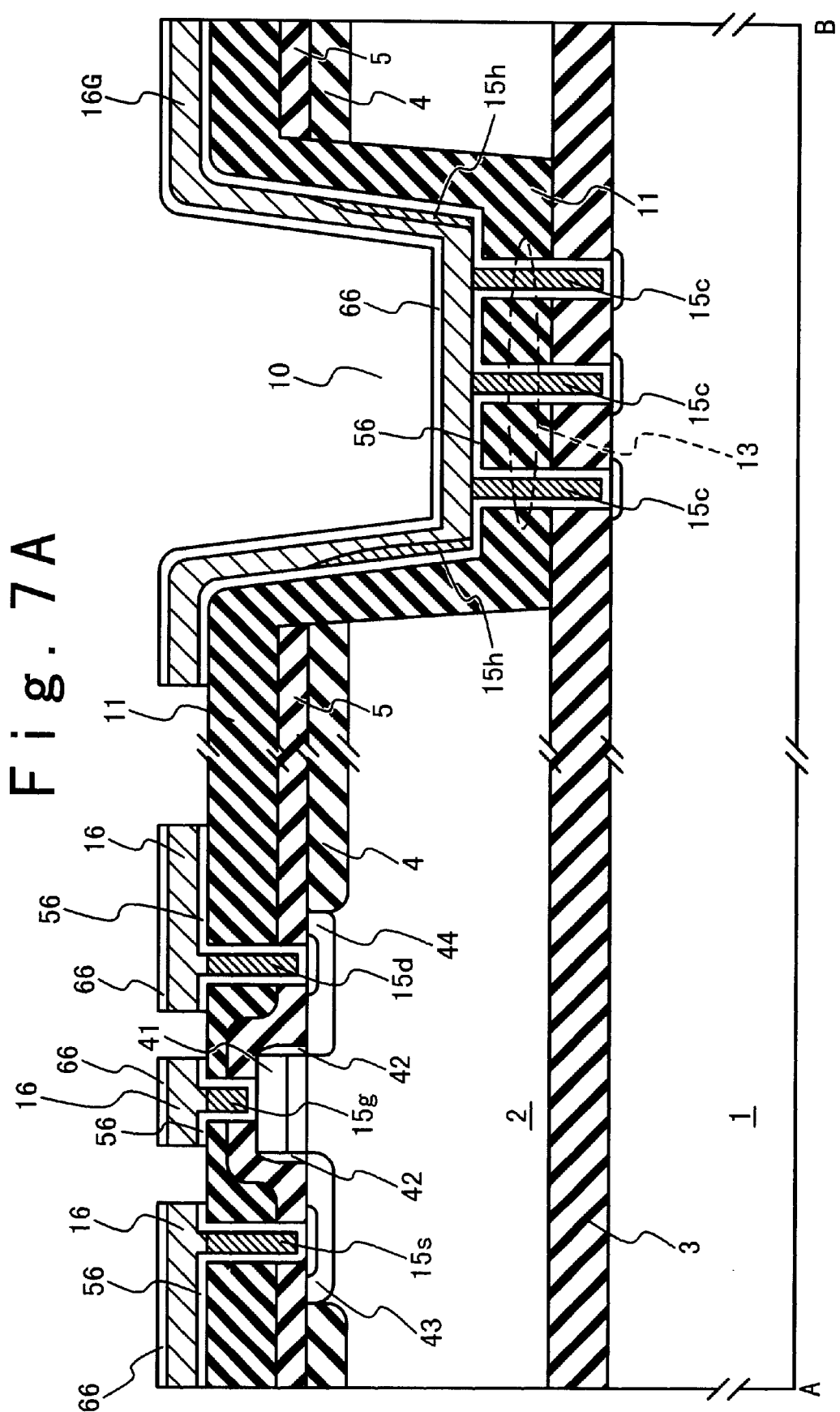

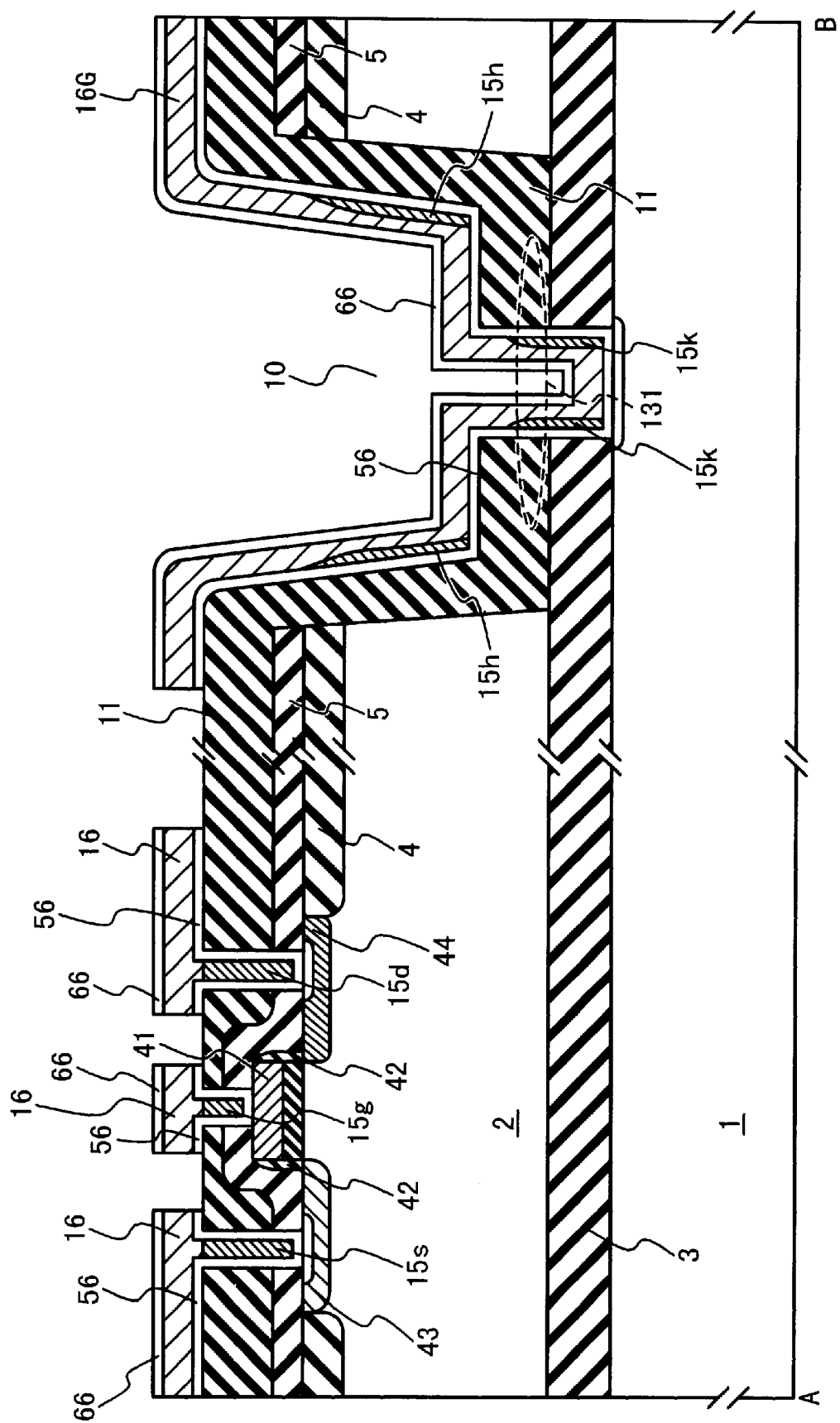

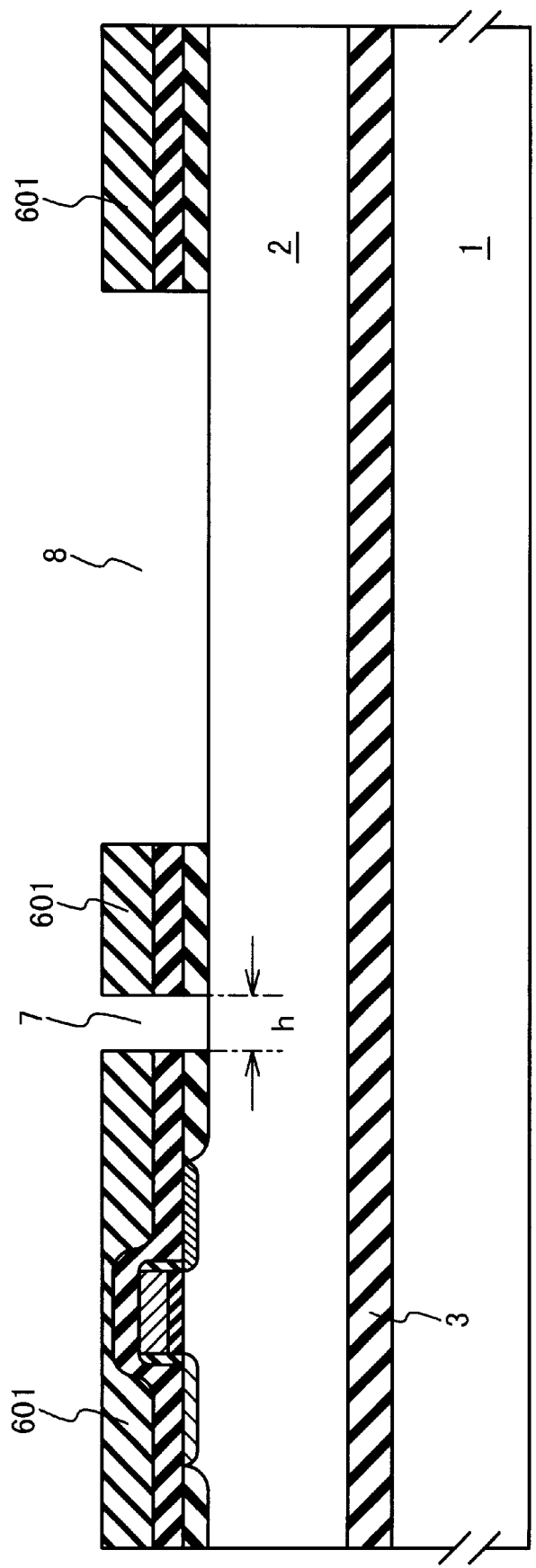

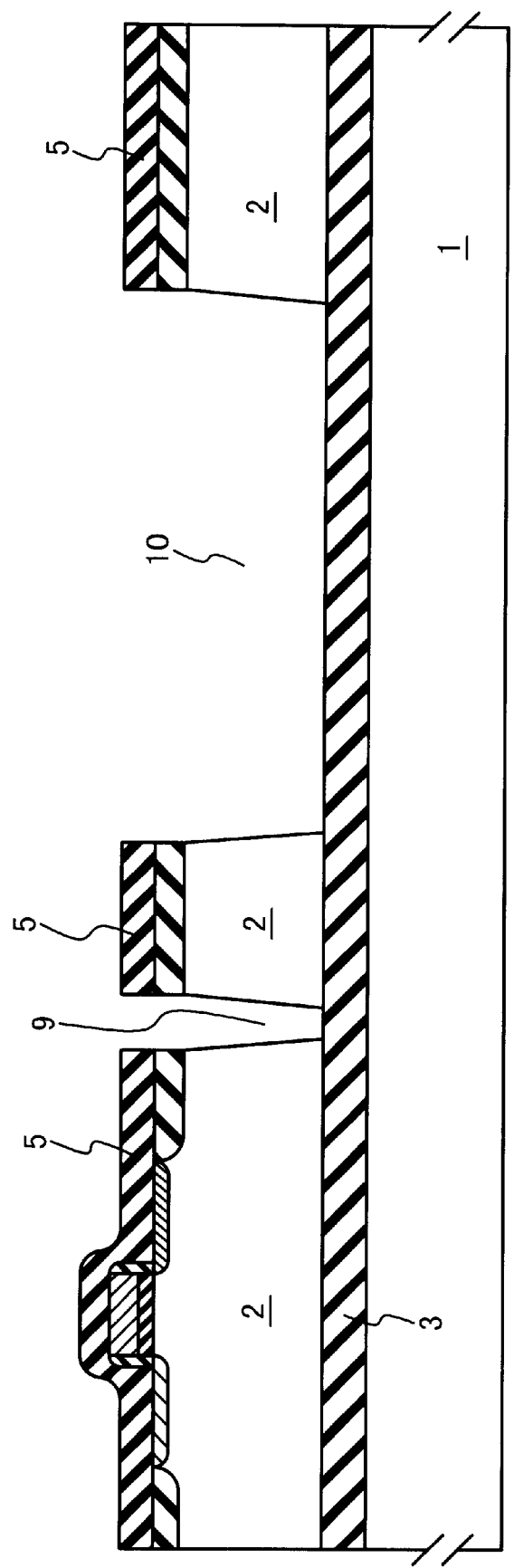

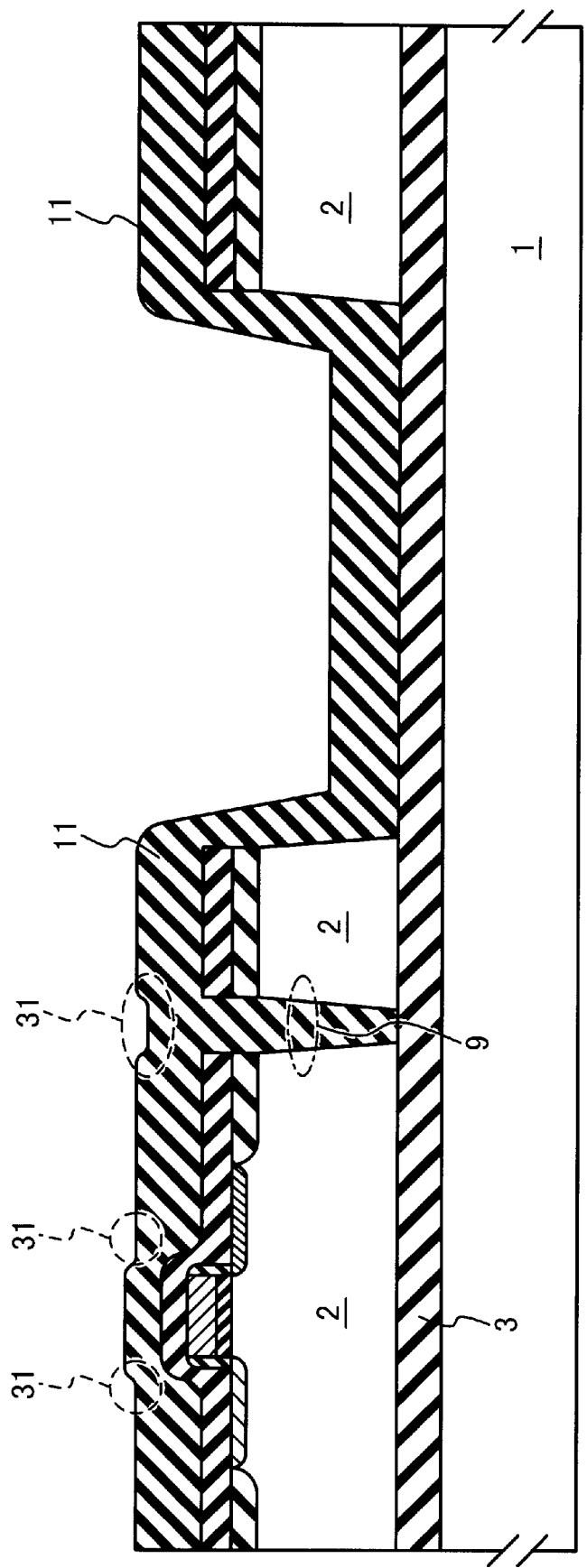

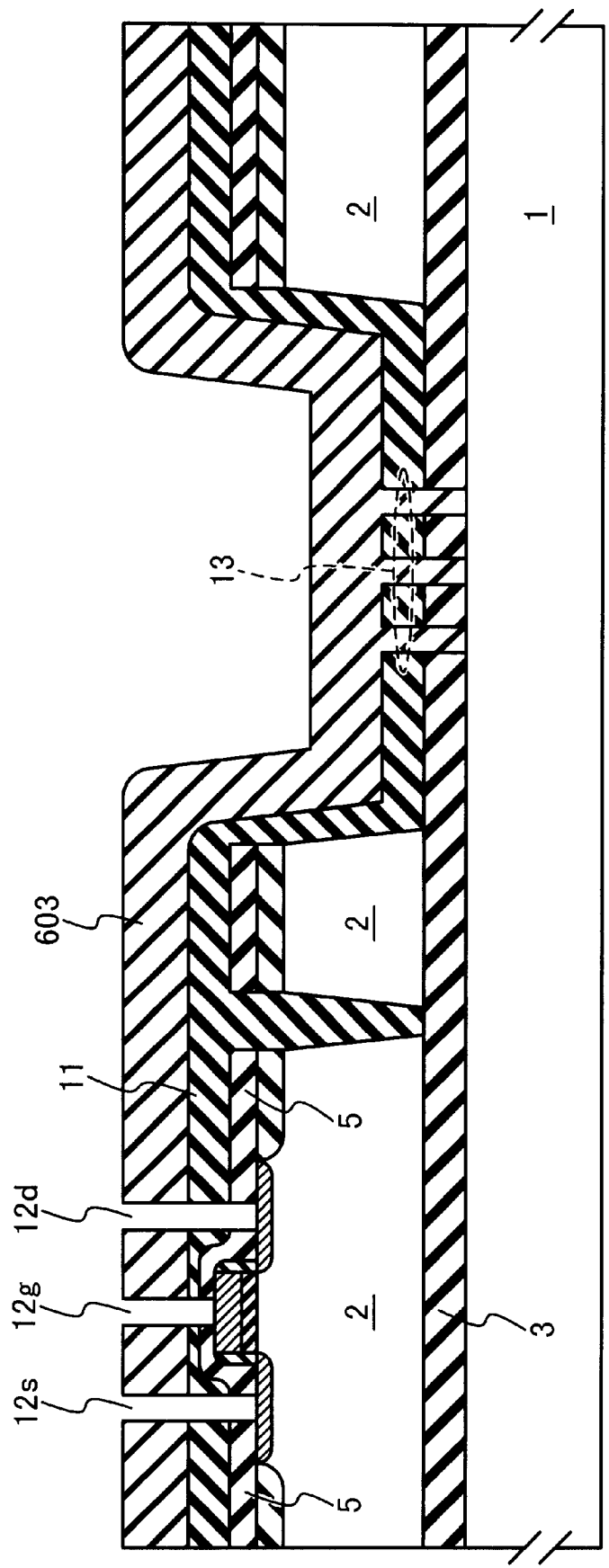

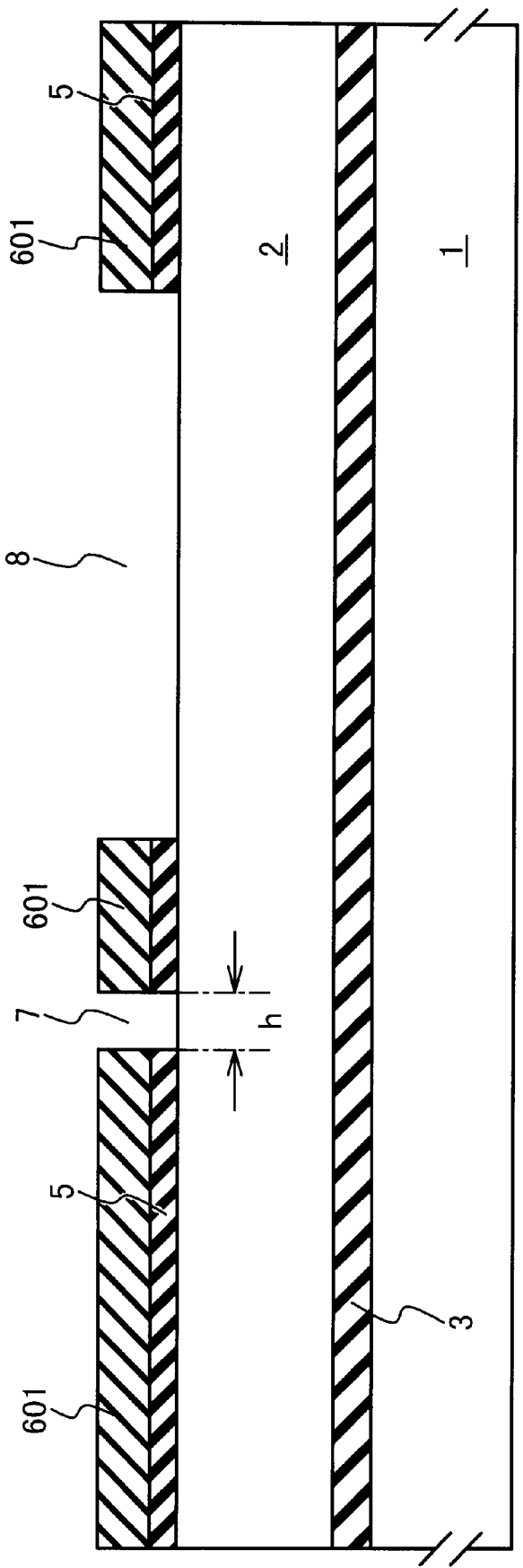

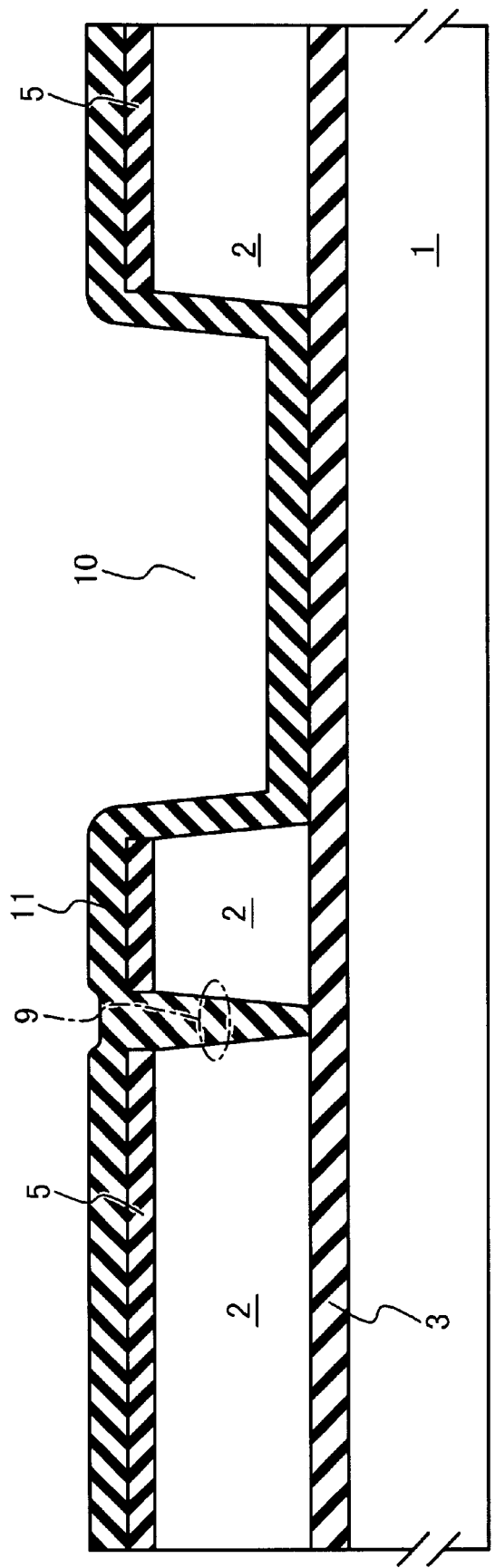

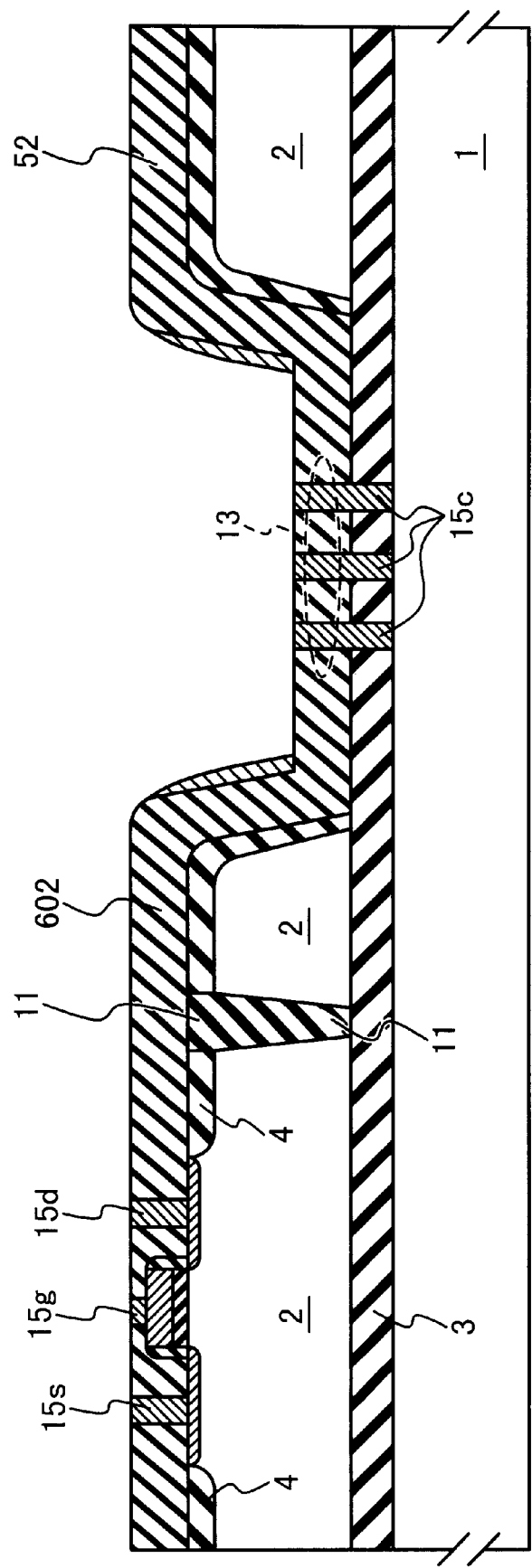

SEMICONDUCTOR DEVICE WITH SOI STRUCTURE AND METHOD OF MANUFACTURING THE SAME

BACKGROUND OF THE INVENTION

1. Field of the Invention

The present invention relates to a semiconductor device with a SOI structure and a method of manufacturing the same.

2. Description of the Related Art

The substrate structure of a chip of a semiconductor device of the present invention is not limited in particular. However, the present invention is applied to a so-called SOI (Silicon On Insulator) which is the most popular structure. The SOI structure is formed by use of the techniques such as a SIMOX (Separation by Implanted Oxygen) method using ion implantation of oxygen ions, and a method of bonding silicon substrates. For example, as a chip 110 shown in FIG. 1A, the structure is formed in which an insulating film 303 and a single crystal semiconductor layer 302 are formed in this order on a support substrate 301 usually made of a silicon substrate.

The semiconductor device using the substrate having the SOI structure (hereinafter, referred to as an SOI semiconductor device) is preferable for the application requiring a high breakdown voltage. In the SOI semiconductor device, a chip is typically mounted on an island of a package by conductive adhesive, and an external connection electrode on the chip are individually connected to predetermined external terminals by use of a wire bonding method, similarly to a typical semiconductor device. The island is connected to any of the external terminals, which is a ground terminal in many cases. In this case, the support substrate can be connected through the island to the ground.

In the SOI semiconductor device, a mounting method or an assembling method such as a chip-on-board method using a flip chip (hereinafter, referred to as COB method) or a tape carrier package (hereinafter, referred to as TCP) method is employed for a higher density mounting method. In this case, as shown in FIGS. 1A and 1B the external connection electrode (not shown) provided on the single crystal semiconductor layer 302 of the chip 110 and a conductive wiring 71 of a wiring substrate 70 to be mounted or an inner lead 80 of TCP are connected to each other through a bump 201. Therefore, there is a problem that it is difficult to apply a potential to the support substrate 301.

If the support substrate is in a floating potential, a potential variation in the support substrate has an adverse influence on an operation of an element, in particular, a threshold potential. As a result, an operation margin of the element is reduced. Also, as disclosed in Japanese Patent No. 2654268, Japanese Laid Open Patent Application (JP-A-Heisei 8-153781) or Japanese Laid Open Patent Application (JP-A-Heisei 8-236754), the breakdown voltage of the element changes depending on the potential of the support substrate. Therefore, if the potential of the support substrate is varied during the operation of the semiconductor element, the breakdown voltage of the element decreases so that there is a possibility of the occurrence of an erroneous operation.

As a method of avoiding the support substrate from being in the floating state, for example, Japanese Laid Open Patent Application (JP-A-Heisei 6-244239) (hereinafter, referred to as a conventional example 1) discloses an example of an SOI semiconductor device in which a potential can be applied from a surface of an element side to the support substrate. FIG. 2 is a sectional view showing the semiconductor device disclosed in the conventional example 1. With reference to FIG. 2, a semiconductor layer 703 of the semiconductor device disclosed in the conventional example 1 is insulated from a semiconductor substrate 701 by an intervening layer insulating film 702. However, conductors 710 are provided on side walls of a concave portion 709 to extend to the semiconductor substrate 701 so that a short-circuit is formed between the semiconductor substrate 701 and a peripheral region 703b. Thus, the same potential as that of the peripheral region 703b is applied to the semiconductor substrate 701. The potential is applied to the peripheral region 703b through a bump 707 from a wiring substrate (not shown), similarly to an element formation region. That is, the potential is applied to the semiconductor substrate 701 from the surface side of the semiconductor layer 703 on which the element is formed.

Also, Japanese Laid Open Patent Application (JP-A-Heisei 2-54554) (hereinafter, referred to as a conventional example 2) discloses a structure in which a semiconductor device is manufactured by use of an SOI substrate and separated into elements by an embedded insulating film. In the conventional example 2, a conductive substrate is used as a lower layer of an insulating film constituting the SOI structure. FIG. 3 is a sectional view showing a main portion of the semiconductor device shown in the conventional example 2. With reference to FIG. 3, the semiconductor device disclosed in the conventional example 2 has a structure in which an insulating film 802 and a conductive semiconductor layer 803 are bonded in this order on a conductive substrate 801. An element body 804 is formed in the semiconductor layer 803. An element separation trench 805 is provided to contact the insulating film 802 at its bottom and to surround the element body 804. The element separation trench 805 is filled with a fill material 814 made of an insulator or polysilicon. The fill material 814 contains therein a conductive fill material 851 made of a p-type polysilicon layer reaching the insulating film 802 from the surface of the element separation trench 805. An opening 821 is formed in the insulating film 802 to connect the conductive fill material 851 and the conductive substrate 801. In the semiconductor device in the conventional example 2, the conductive substrate 801 and an electrode 807 provided on the surface of the fill material 814 are connected by the conductive fill material 851. Thus, the conductive substrate 801 can be used as the conductive material. Therefore, it is possible to reduce the crowded condition of surface wiring lines.

In the semiconductor device of the conventional example 1, the formation of a trench for the element separation region and the formation of a concave trench for a substrate contact are independently carried out as the different processes. Therefore, it is necessary to etch and remove the semiconductor layers 703 at the different positions of the SOI substrate two times. As a result, there is a problem that the manufacturing process becomes long. Also, the structure is designed in such a manner that the route connecting a bump electrode 707 for applying the potential to the support substrate and the support substrate 701 must pass through a peripheral region 703b of the semiconductor layer. Thus, there is another problem that the drop of the resistance in the route is limited.

Also, in the method of manufacturing the semiconductor device in the conventional example 2, a first trench as the trench for the element separation and a second trench having the width wider than that of the first trench are formed at the same time. Also, the insulating film 802 in the bottom of the second trench is etched so that the opening 821 is formed to reach the conductive substrate corresponding to the support substrate 801. In this case, a multi-layer film in which a polysilicon film, a nitride film and an oxide film are laminated is required so as not to etch the other regions. Also, the conductive fill material 851 is formed to connect the electrode 807 and the conductive substrate 801 by implanting impurities such as boron into an insulating polysilicon layer. Thus, there is a limit on the drop in the resistance.

It should be noted that Japanese Laid Open Patent Application (JP-A-Heisei 11-135794) discloses the following semiconductor device. In this reference, the semiconductor device has the CMOS structure in which a pair of offset type MOS transistors of a first conductive type and a second conductive type are provided. The transistors are insulated and separated from each other and are formed on an SOI substrate. In the SOI substrate, first and second substrates of the first conductive type are integrally joined to each other through an embedded oxide film. The transistor of the second conductive type is formed to have an LMOS (Lateral MOS) structure, and the transistor of the first conductive type is formed to have an LDMOS (Lateral Double—diffused MOS) structure.

Also, Japanese Laid Open Patent Application 2000-31266 (P2000-31266A) discloses the following semiconductor device. In this reference, the semiconductor device has an opening tapered and wider in width than a bottom on a semiconductor substrate. Insulating material is embedded within the opening, and a trench separation film is provided for insulating and separating between elements. The tapered angle between the inner side of the opening and the surface of the semiconductor substrate is equal to or less than 88 degrees. The insulating material is NSG grown by use of a low pressure CVD method.

SUMMARY OF THE INVENTION

Therefore, an object of the present invention is to provide a semiconductor device with an SOI structure such as an SOI structure, in which a support substrate and an external connection electrode formed on the surface of a chip are connected to each other through a route of a small resistance, and a method of manufacturing the same.

In an aspect of the present invention, a semiconductor device includes a conductive semiconductor substrate laminated on or bonded to a conductive support substrate through a first insulating film, a separation trench which separates a device formation region where at least a desired element is formed, from a region of the semiconductor substrate, a separation trench, and a substrate contact region where the semiconductor substrate is not present. The semiconductor device further includes a second insulating film which fills the separation trench and covers a surface of the substrate contact region, an external connection electrode formed above the semiconductor substrate, and a support substrate connecting section which passes through the first insulating film and the second insulating film in the substrate contact region to connect the external connection electrode and the support substrate.

Here, the external connection electrode may be formed through a third insulating film on the semiconductor substrate. In this case, the third insulating film may be identical to the second insulating film.

Also, the support substrate connecting section may include a conductive film which is connected with the external connection electrode and covers the second insulating film, and a contact section which passes through the first insulating film and the second insulating film to the support substrate in the substrate contact region. In this case, the conductive film desirably contains a metal film having aluminum as main material.

Also, the contact section may be formed of a single contact. In this case, the single contact may include a refractory metal film formed on side wall of a contact hole for the contact, and the conductive film filling the contact hole in which the refractory metal film is formed.

Also, the single contact may include an additional conductive film which covers side wall of a contact hole for the contact, a refractory metal film formed on the additional conductive film on the side wall of the contact hole, and the conductive film filling the contact hole in which the refractory metal film is formed.

Also, the contact section may include a plurality of contact plugs arranged in an array. In this case, the plurality of contact plugs may be formed of tungsten.

In another aspect of the present invention, a method of manufacturing a semiconductor device is attained by (a) forming at least a desired element in a device forming region of a conductive semiconductor substrate on a chip in which the semiconductor substrate is formed on a conductive support substrate through a first insulating film; by (b) forming trenches which pass through the semiconductor substrate to the first insulating film; by (c) forming a second insulating film on the semiconductor substrate to fill the trenches and to cover a side wall of a substrate contact region; by (d) forming element contact holes for the element to pass through said second insulating film; by (e) forming a contact hole section in the substrate hole region to pass through the first and second insulting films to the support substrate; by (f) filling the element contact hole with first conductive material; by (g) filling the contact hole section with second conductive material; by (h) forming a conductive film connected to the contact hole section; and by (i) forming an external connection electrode connected to the conductive film.

Here, the (d) forming step and the (e) forming step may be carried out at a same time.

Also, when the (d) forming step includes a first exposure step and the (e) forming step includes a second exposure step, the first exposure step and the second exposure step may be individually carried out. In this case, the (d) forming step and the (e) forming step may be carried out at a time, except for the first exposure step and the second exposure step.

Also, the (f) filling step and the (g) filling step may be carried out at a time.

Also, the (e) forming step may include the step of forming a single contact hole in the substrate hole region. In this case, the (g) filling step and the (h) forming step may be carried out at a same time.

Also, the (e) forming step may include the step of forming a plurality of contact holes arranged in an array in the substrate hole region.

BRIEF DESCRIPTION OF THE DRAWINGS

FIGS. 7A and 7B are sectional views schematically showing modifications of the chip of the semiconductor device in the first embodiment along the A–A' section of FIG. 5;

FIGS. 10A to 10E, FIGS. 11A to 11E and FIGS. 12A to 12D are sectional views schematically showing the semiconductor device in the manufacturing method according to the first embodiment of the present invention, in a main portion along the A–B line of FIG. 5;

FIGS. 22A to 22D, FIGS. 23A to 23C, and FIGS. 24A to 24D are sectional views showing the semiconductor device in the manufacturing method according to the fourth embodiment of the present invention.

DESCRIPTION OF THE PREFERRED EMBODIMENTS

Hereinafter, a semiconductor device of the present invention will be described below in detail with reference to the attached drawings.

Figure 4:
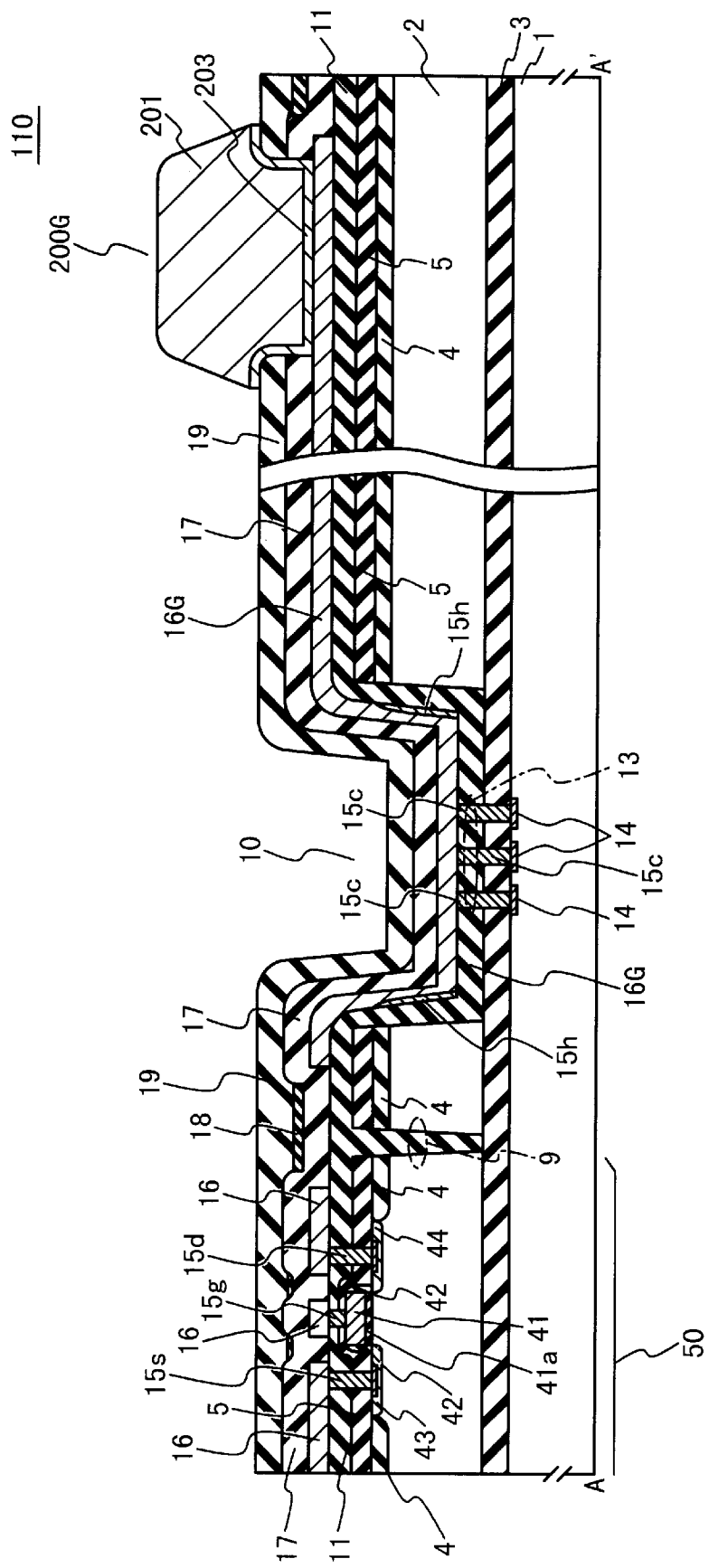
FIG. 4 is a sectional view explaining a structural example of a chip of a semiconductor device according to a first embodiment of the present invention.
Figure 5:
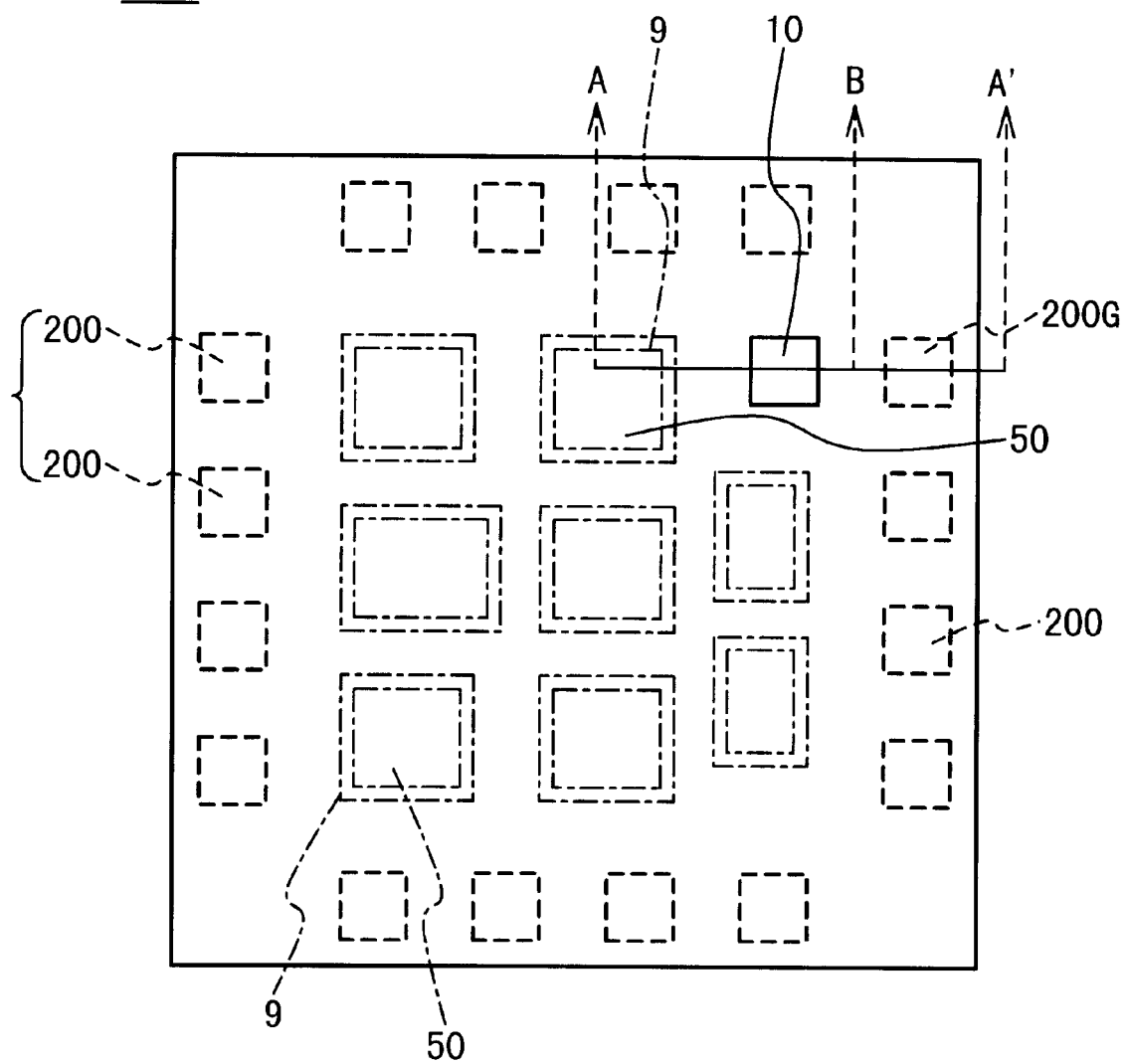
FIG. 5 is a plan view schematically showing the chip of the semiconductor device of the present invention.

FIG. 4 is a cross sectional view showing a chip 110 of a semiconductor device according to the first embodiment of the present invention. FIG. 5 is a plan view schematically showing a chip 110, and FIG. 4 shows a cross section along the A–A' line in FIG. 5. With reference to FIG. 4, in the chip 110 in the first embodiment, a silicon oxide ($SiO_2$) film 3 and a P-type silicon (Si) substrate 2 are laminated or bonded in this order on one main surface of a P-type silicon (Si) substrate 1. The silicon oxide film 3 has the film thickness of about 1 $\mu$m as a first insulating film. The silicon substrate has the resistivity of 10 $\Omega$cm and the thickness of 5 $\mu$m as a support substrate. The silicon substrate 1 has the resistivity of 10 $\Omega$cm and the thickness of 650 $\mu$m.

The chip 110 is composed of a plurality of element formation regions 50 which are insulated and separated by separation trenches or grooves 9 in the silicon substrate 2, and substrate contact regions 10. Each of the substrate contact regions 10 has the shape of 10×10 $\mu$m and is formed in a proper empty region on the chip 110 by removing the second silicon substrate 2. The chip 110 is further composed of a plurality of external connection electrodes 200 and 200G.

A substrate contact hole 13 as a first contact hole is provided for the substrate contact region 10 to pass through an insulating film 11 formed by use of TEOS (tetra-ethoxy-silane ($Si(OC_2H_5)_4$) gas and the silicon oxide film 3 to the silicon substrate 1. The substrate contact hole 13 is filled with metal, such as tungsten (W) 15c as a refractory metal, and is connected through a metal film wiring as a support substrate connecting wiring formed of aluminum (Al) wiring 16G to a predetermined external connection electrode 200G. The refractory metal functions a barrier metal.

In this embodiment, the substrate contact hole 13 has a multi-contact structure in which a plurality of minimum dimensional contact holes used in the chip 110 are arrayed. Usually, a minimum dimensional contact hole is used in the element formation region 50. In the external connection electrodes 200 and 200G, a protective oxide film 17 and a protective nitride film 19 for covering the Al wirings 16 and 16G are removed and opened so that the Al is exposed. Then, for example, a gold (Au) bump 201 is formed thereon through an adhesive metal film 203 such as titanium (Ti) film.

Also, desirable elements to attain the function of the semiconductor device are formed on the surface side of each element formation regions 50, i.e., on the side opposite to the junction with the silicon oxide film 3. As an example, FIG. 4 shows a source diffusion layer 43, a drain diffusion layer 44, a gate electrode 41, a gate oxide film 41a and a side wall oxide film 42 in an electric field transistor (MOSFET). It should be noted that the element formed in the element formation region 50 is not any essential element in the present invention, and it is not limited. Therefore, in the following drawings, the reference symbols of the elements are suitably omitted in order to avoid the complex explanation and easily describe it.

Figure 1A:
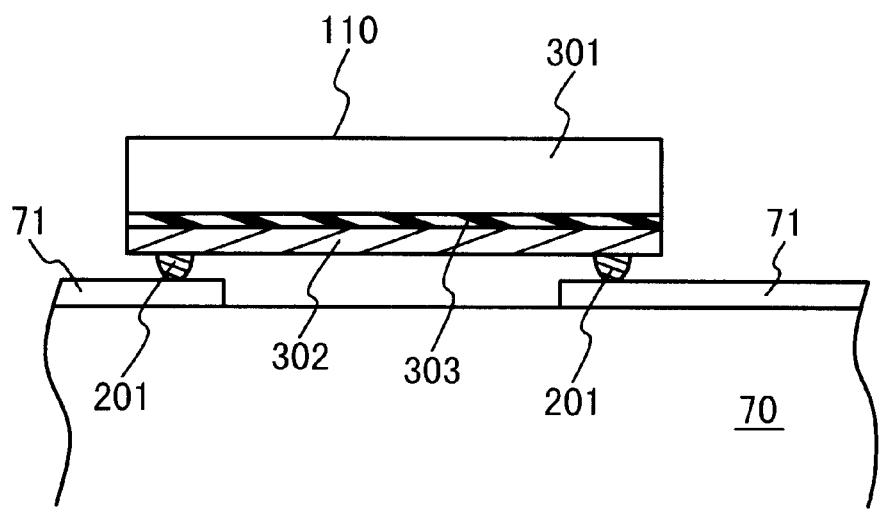
FIG. 1A is a view schematically showing a COB mounting state of a conventional SOI semiconductor device.
Figure 1B:
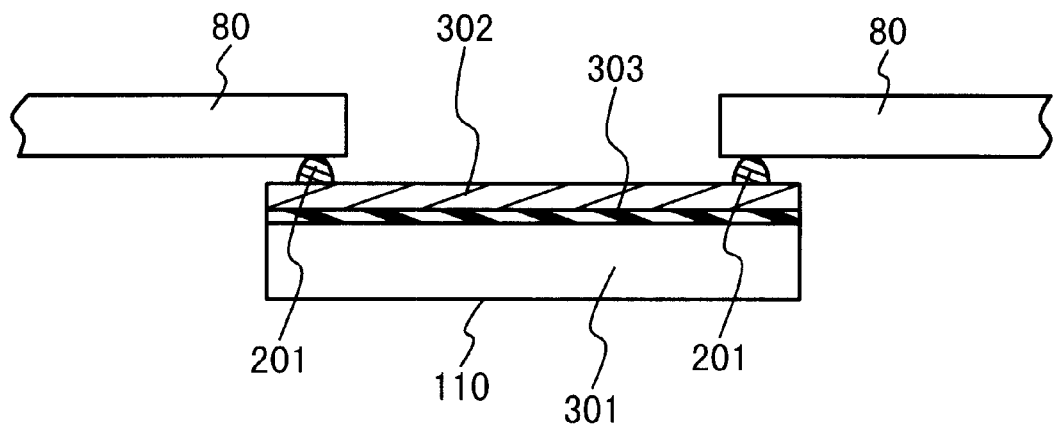
FIG. 1B is a view schematically showing a TCP assembling condition of a conventional SOI semiconductor device.

In the semiconductor device in the first embodiment, the chip 110 has the above-mentioned structure. As shown in FIGS. 1A and 1B), a bump 201 is directly connected onto a wiring 71 formed on a mount wiring substrate 70 in case of the COB mounting method, and a bump 201 is directly connected to an inner lead 80 in case of the TCP assembly. However, even if the silicon substrate 1 serving as a support substrate 301 is not connected directly to a potential supply conductor such as an island, a predetermined potential can be applied from an external portion through the external connection electrode 200G and the bump 201 provided on the surface of the silicon substrate 2 as a single crystal semiconductor layer.

Moreover, the route from the bump 201 on the surface of the chip 110 to the silicon substrate 1 is perfectly made of metal film, including the fill material of the contact hole 13. Also, predetermined impurity of a high density is implanted into a contact portion 14 of the silicon substrate 1 to reduce a contact resistance. At this time, for example, the density of boron (B) is about $10^{14}$ to $10^{15}$ atms cm$^{-2}$ in the case of the P-type substrate. Thus, the entire resistance of the route to apply the potential to the silicon substrate 1 as the support substrate can be sufficiently small to thereby stabilize the potential of the support substrate.

Figure 6:
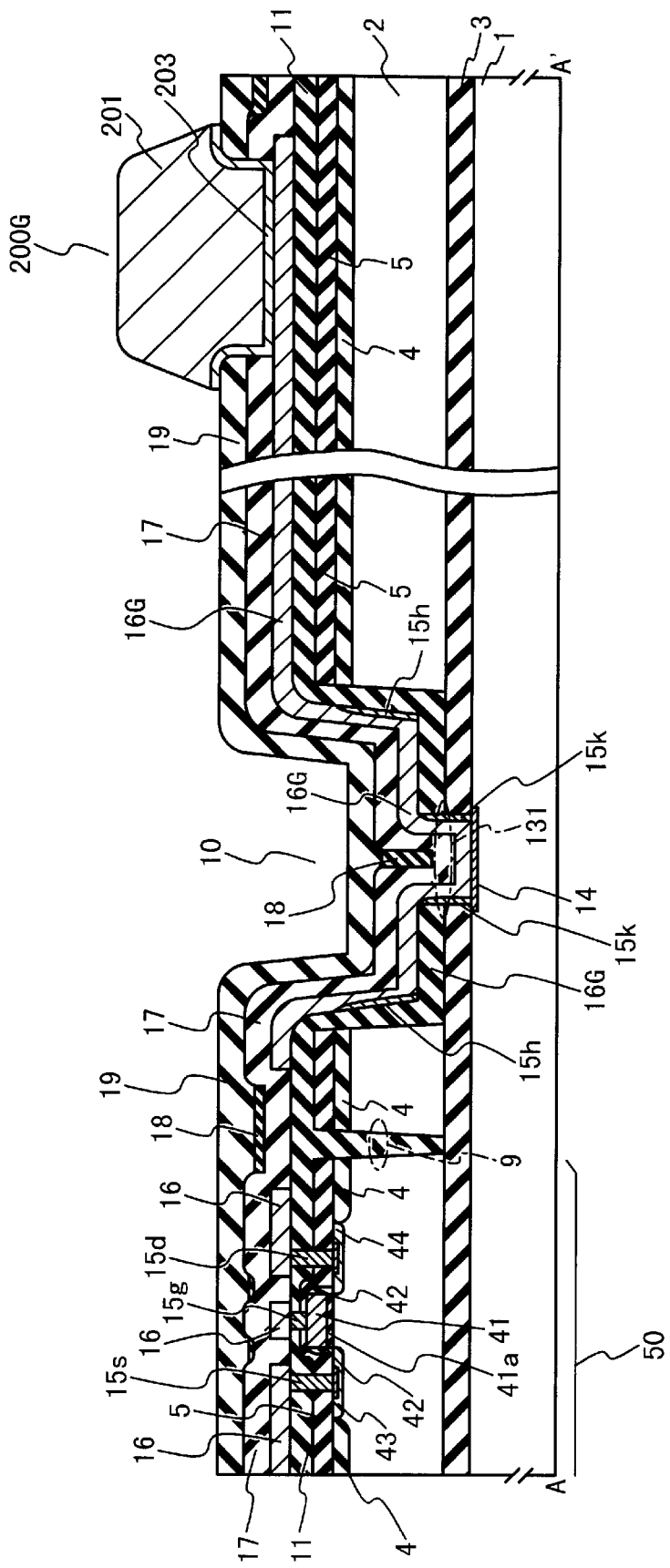
FIG. 6 is a sectional view schematically showing another structural example of the chip of the semiconductor device in the first embodiment along the A–A' line of FIG. 5.

It should be noted that the first embodiment is described using the example in which the contact hole 13 connected to the silicon substrate 1 has the multi-contact structure. However, as shown in FIG. 6, the contact hole 13 may be formed as a single contact hole 131 having a sufficient dimension. In this case, tungsten (W) 15 fills the minute contact hole and only a tungsten film 15k remains on the side wall of the contact hole 131. However, an Al film as the wiring metal film is sufficiently deposited within the contact hole 131. Since the tungsten film 15k remains, the connection can be established without any problem of the disconnection in the step portion of the contact hole 131.

As shown in FIGS. 7A and 7B, a barrier metal film 56 of titanium nitride (TiN) may be laid as a lower layer of the Al wiring 16 to have a predetermined thickness. Moreover, a protective film 66 of TiN, polysilicon and the like may be further formed as an upper layer.

The method of manufacturing the semiconductor device according to the present invention will be described below, especially with the above-mentioned chip manufacturing method as a target.

Figure 8:
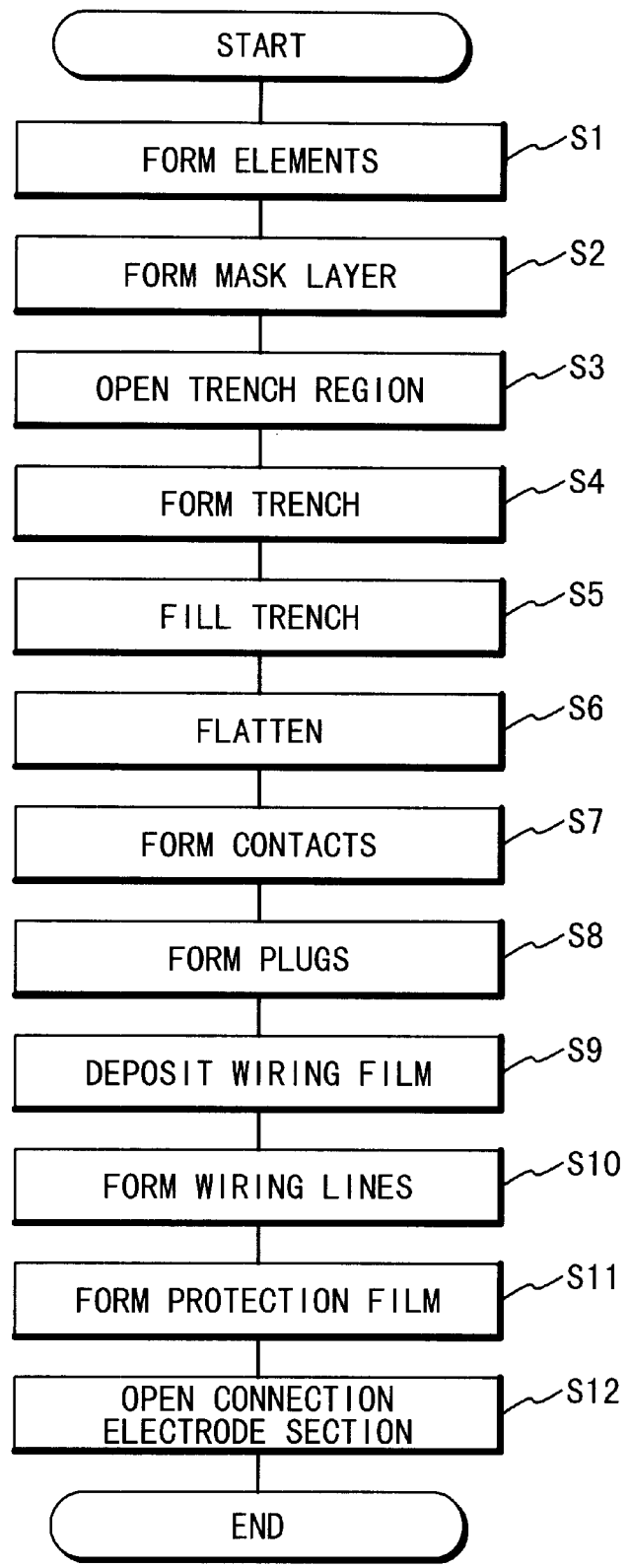
FIG. 8 is a schematic flowchart showing a manufacturing method of a semiconductor device according to the first embodiment of the present invention.
Figure 9:
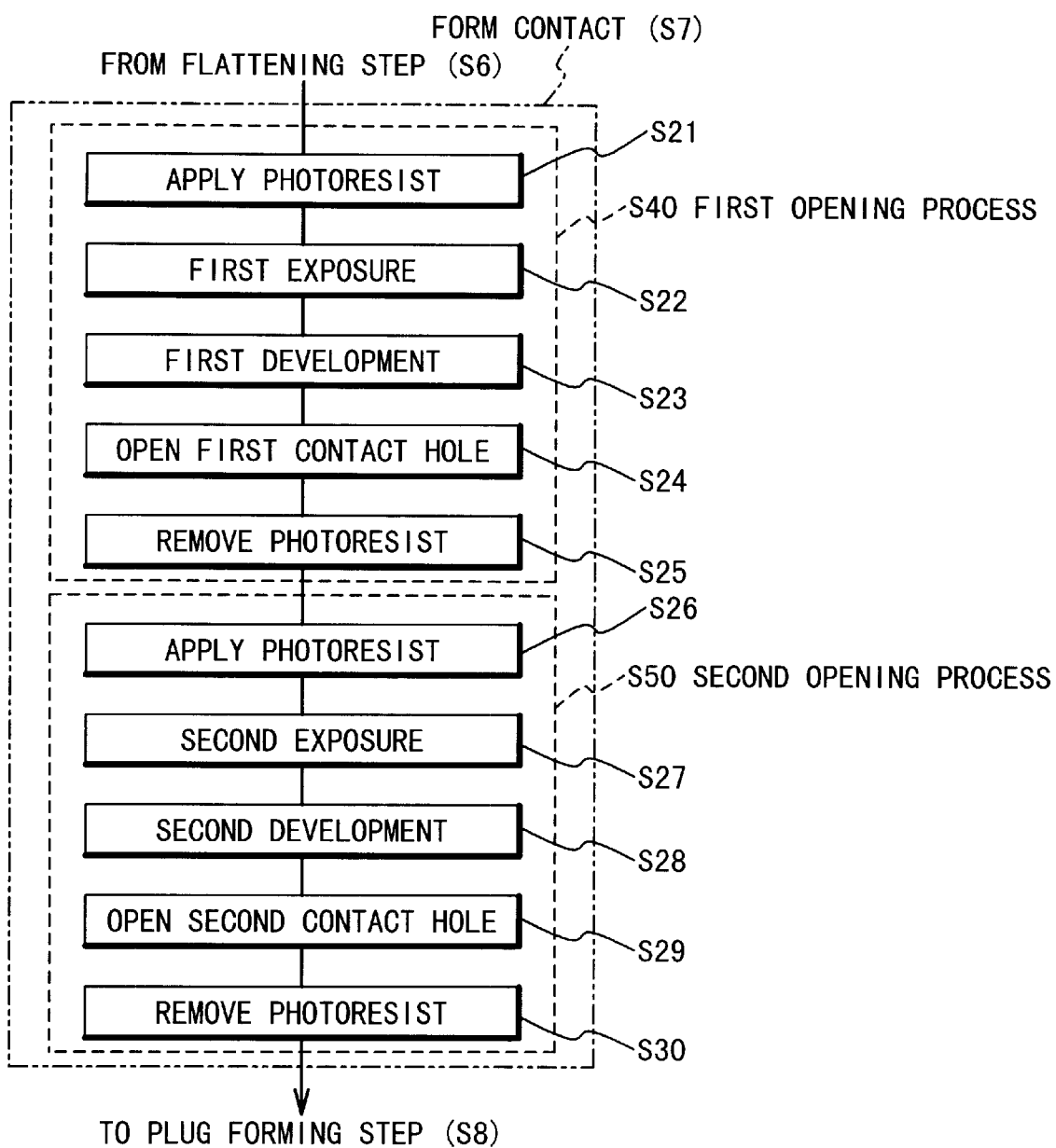
FIG. 9 is a detailed flowchart of a contact step of FIG. 8.

FIG. 8 is a flow chart showing the chip manufacturing method in the first embodiment in case of a one-layer wiring structure. FIG. 9 is a detailed flowchart of a contact step of FIG. 8. And, FIGS. 10A to 10E, FIGS. 11A to 11E and FIGS. 12A to 12D are sectional views schematically showing the main portion of the semiconductor device along the A–B line of FIG. 2. It should be noted that when the chips 110 is manufactured, the technique is well known in which the chips are formed in a form of matrix on a wafer 100, as schematically shown in FIG. 13. Therefore, the sectional view for each step will be described with reference to FIGS. 4 to 9 and 13, as necessary.

With reference to FIGS. 8 and 9, the manufacturing method in the first embodiment at least includes an element forming step S1, a mask layer forming step S2, a trench region opening step S3, a trench forming step S4, a trench filling step S5, a flattening step S6, a contact step S7, a plug forming step S8, a wiring film depositing step S9, a wiring forming step S10, a protective film forming step S11 and an external connection electrode opening step S12. Also, the contact step S7 is composed of a first opening step S40 and a second opening step S50. The first opening step S40 is composed of a photo resist coating step (hereinafter, referred to as PR step) S21, a first exposing step S22, a first developing step S23, a first contact hole opening step S24 and a PR removing step S25. The second opening step S50 is composed of a PR coating step S26, a second exposing step S27, a second developing step S28, a second contact hole opening step S29 and a PR removing step S30. The respective steps will be described below in detail.

Figure 10A:
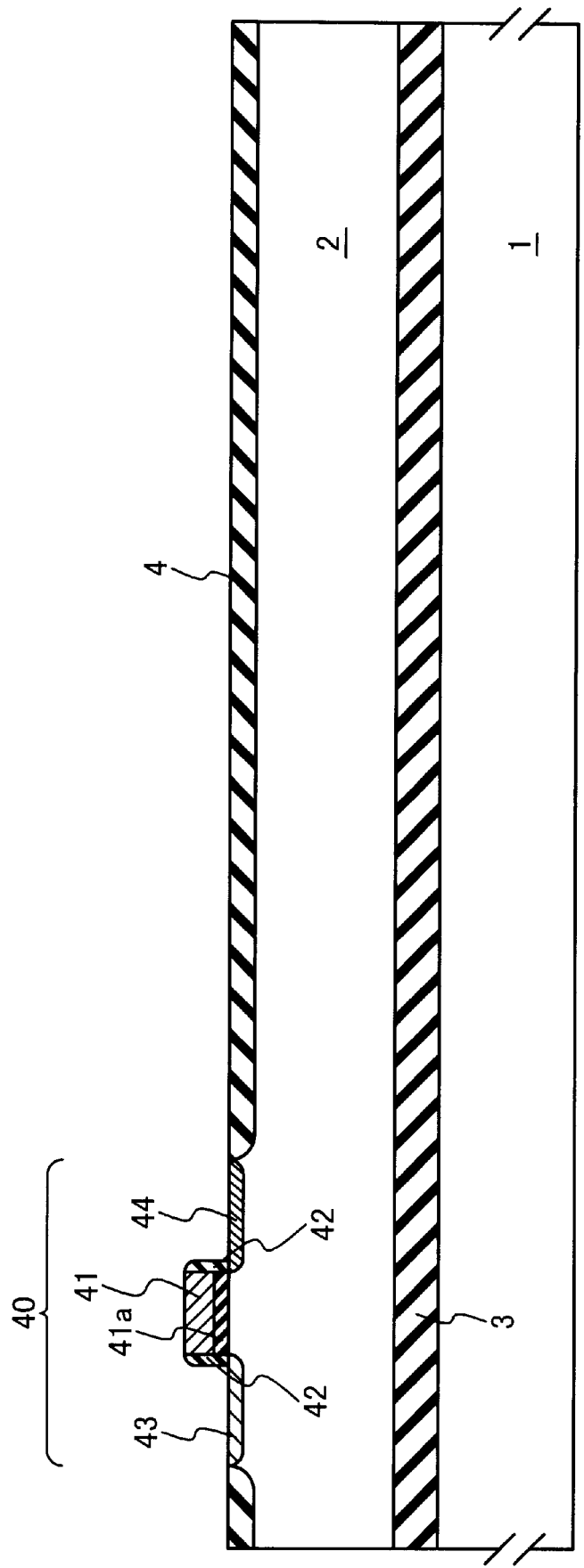

At first, as shown in FIG. 10A, at the element forming step S1, a silicon oxide film 3 and the P-type silicon substrate 2 are laminated or bonded in this order on one main surface of a P-type silicon substrate 1. The silicon oxide film 3 has the film thickness of about 1 μm as the first insulating film and the P-type silicon substrate 2 has the resistivity of 10 Ωcm and the thickness of 5 μm. The P-type silicon substrate 1 has the resistivity of 10 Ωcm and the thickness of 650 μm. A field insulating film 4 and desirable elements are formed on the surface of the wafer 100 having a diameter of 6 inches on the side opposite to the junction plane with the silicon oxide film 3 of the silicon substrate 2 by use of a known method. Here, only MOSFET 40 is illustrated as an example of the element.

Figure 10B:
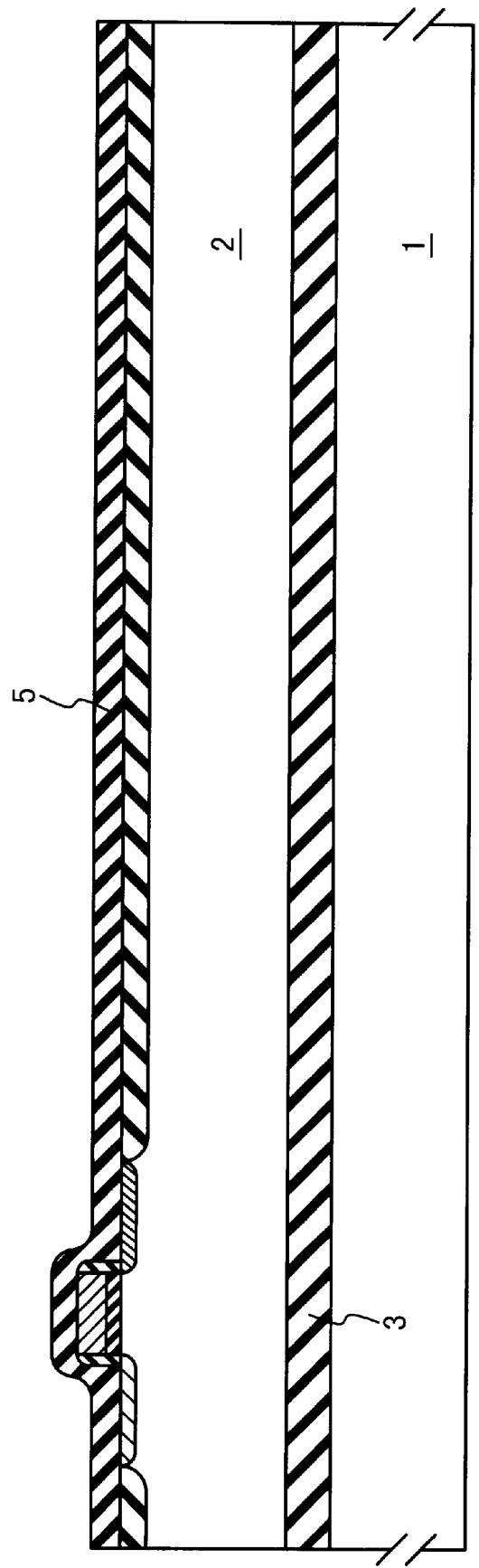

As shown in FIG. 10B, at the mask layer forming step S2, an silicon oxide film 5 as a second insulating film is deposited to have the thickness of about 0.5 μm on the entire surface of the wafer 100 by use of a chemical vapor deposition (hereinafter, referred to as CVD) method.

Next, as shown in FIG. 10C, at the trench region opening step S3, a photo-resist 601 is coated on the entire surface of the wafer 100. Then, exposure and development are carried out using a predetermined reticle (not shown). As a result, a pattern for a separation trench formation opening 7 is formed to have a width h (desirably, $1\,\mu m \leq h \leq 2\,\mu$). Also, a pattern for a substrate contact region formation opening 8 is formed. Thus, an element formation region is separated. Moreover, the silicon oxide films 5 of the openings 7 and 8 and the field oxide film 4 are removed by use of the known etching technique. Thus, the silicon substrate 2 is exposed.

As shown in FIG. 10D, at the trench forming step S4 after the removal of the photo-resist 601, the silicon oxide film 5 is used as an etching mask, and the exposed portion of the silicon substrate 2 is removed by an anisotropic etching technique. Accordingly, the silicon oxide film 3 is exposed to thereby form the separation trench 9 and the substrate contact region 10. At this time, slight inclination is given to the side walls of the substrate contact region 10 and separation trench 9 so that the upper end of the opening on the surface side is larger in diameter than the bottom where the silicon oxide film 3 is exposed.

Next, as shown in FIG. 10E, at the trench filling step S5, the TEOS oxide film 11 is deposited on the entire surface of the wafer 100 by a low pressure CVD (LPCVD) method using TEOS gas and is formed as the insulating material to fill the separation trench 9.

Figure 11A:
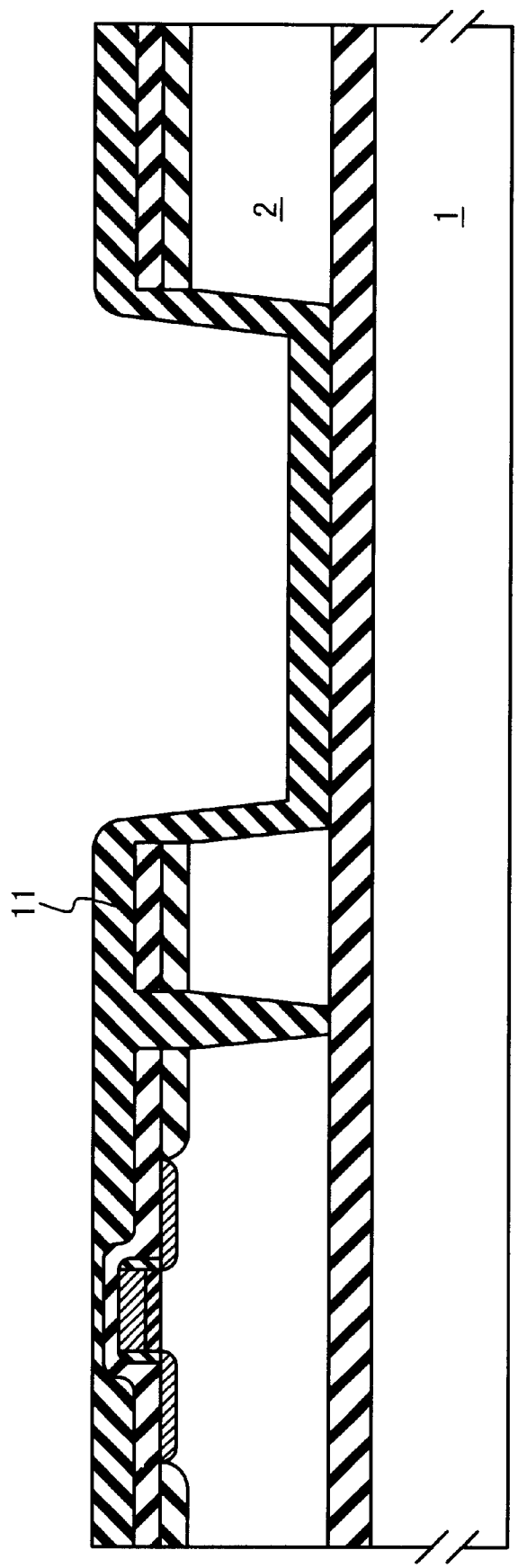

Next, as shown in FIG. 11A, at the flattening step S6, the TEOS oxide film 11 is etched back to be removed from the entire surface. Thus, a step 31 appearing in the element formation region 50 is eliminated.

Figure 11B:
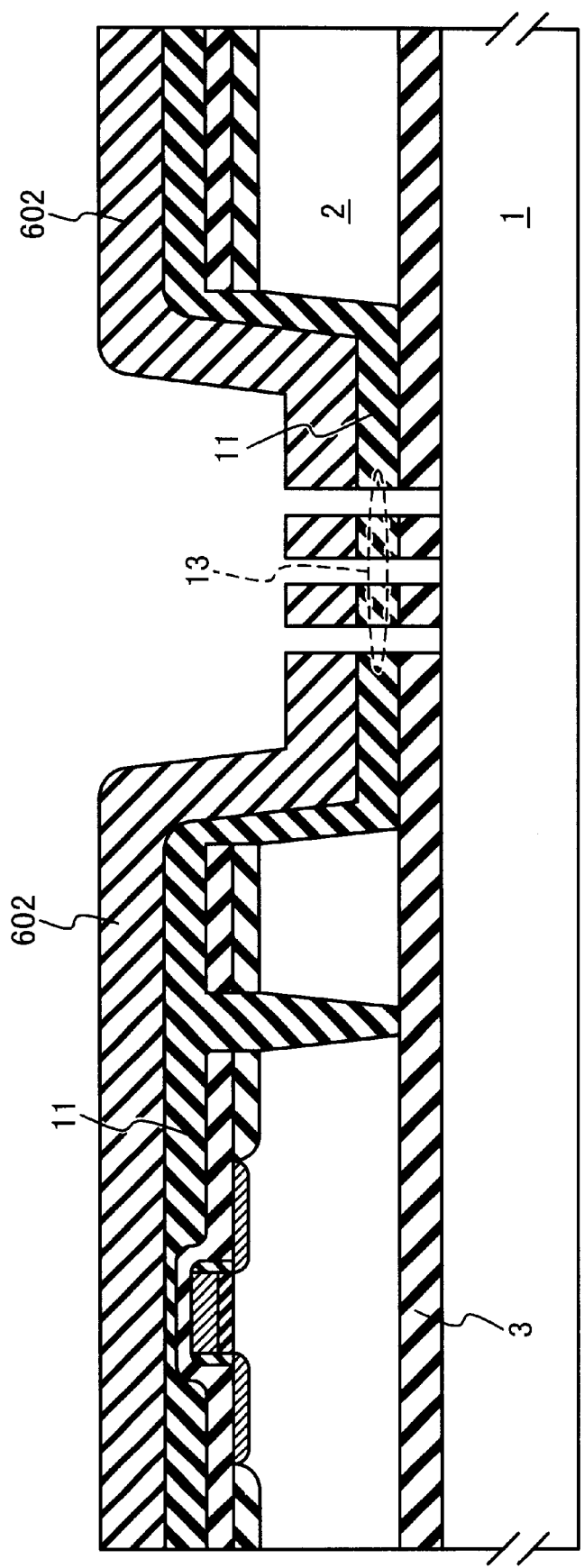

Next, as shown in FIG. 11B, the contact step S7 is carried out. At first, at the photo-resist coating step S21 in the first opening step S40, a photo-resist 602 is coated on the entire surface of the wafer 100. At the first exposing step S22, the exposure is carried out by use of the reticle (not shown) having the pattern for the contact hole 13 as a predetermined first contact hole. At the first developing step S23, the pattern for the contact hole 13 is developed to form the pattern of the contact hole 13 connected to the silicon substrate 1 at a predetermined position of the substrate contact region 10. Then, at the first contact hole opening step S24, the TEOS oxide film 11, the silicon oxide film 5 and the silicon oxide film 3 are etched and removed to open the contact hole 13 reaching the silicon substrate 1. After that, the photo-resist 602 is removed.

As shown in FIG. 11C, at the photo-resist coating step S26 in the second opening step S50, a photo-resist 603 is coated on the entire surface of the wafer 100. At the second exposing step S27, exposure is carried out by use of the reticle (not shown) having the pattern for a contact hole 12 as a predetermined second contact hole. At the second developing step S28, the pattern for the contact hole 12 is developed to form the pattern for the contact hole 12 (12s, 12g, 12d) connected to each element formed in the element formation region 50. Then, at the second contact hole opening step S29, the TEOS oxide film 11 and the silicon oxide film 5 are etched and removed to open the contact hole 12. After that, the photo-resist 603 is removed.

It should be noted that the contact holes of the minimum dimension used in the chip 110 are formed as a set of contact holes. Usually, the minimum size of hole can be filled with predetermined metal at the later plug forming step S8. For example, in a case of tungsten (W), a size of 0.5 μm×0.5 μm to 1.0 μm×1.0 μm is desirable for the contact hole. In this case, the contact hole 12 is formed in accordance with the element as a single contact structure using only one contact hole or a multi-contact structure in which a plurality of contact holes are arrayed. It should be noted that any of the first opening process S40 and the second opening process S50 may be firstly carried out.

Impurity of a predetermined amount is implanted into each contact region 14, as necessary. For example, if boron is implanted for a P-type diffusion region, an implantation amount N is desired to be about $10^{14}$ atms $cm^{-2} \leq N \leq 10^{15}$ atoms $cm^{-2}$.

Figure 11D:
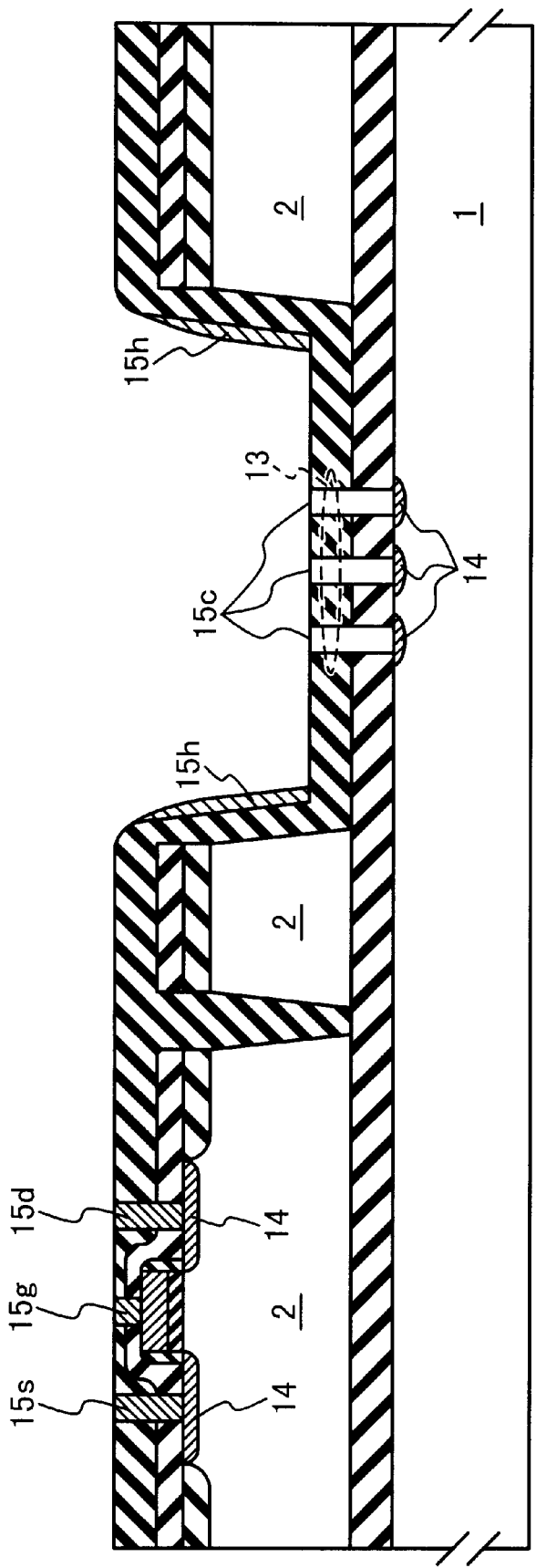

Next, as shown in FIG. 11D, at the plug forming step S8, a tungsten layer is deposited on the entire surface of the wafer 100 by a CVD method, and the contact holes 12 and the contact holes 13 are filled with tungsten. Then, the tungsten layer is etched back from the entire surface to thereby remove tungsten on the TEOS oxide film 11 in the flattened portion. Thus, in the contact holes 12 and 13, a tungsten plug 15s, a tungsten plug 15d, a tungsten plug 15g and a tungsten plug 15c remain as the fill metal. Also, the portions of the contact holes 12 and 13 are flattened. It should be noted that at the time, a tungsten film 15h also remains on the side wall of the substrate contact region 10.

Figure 11E:
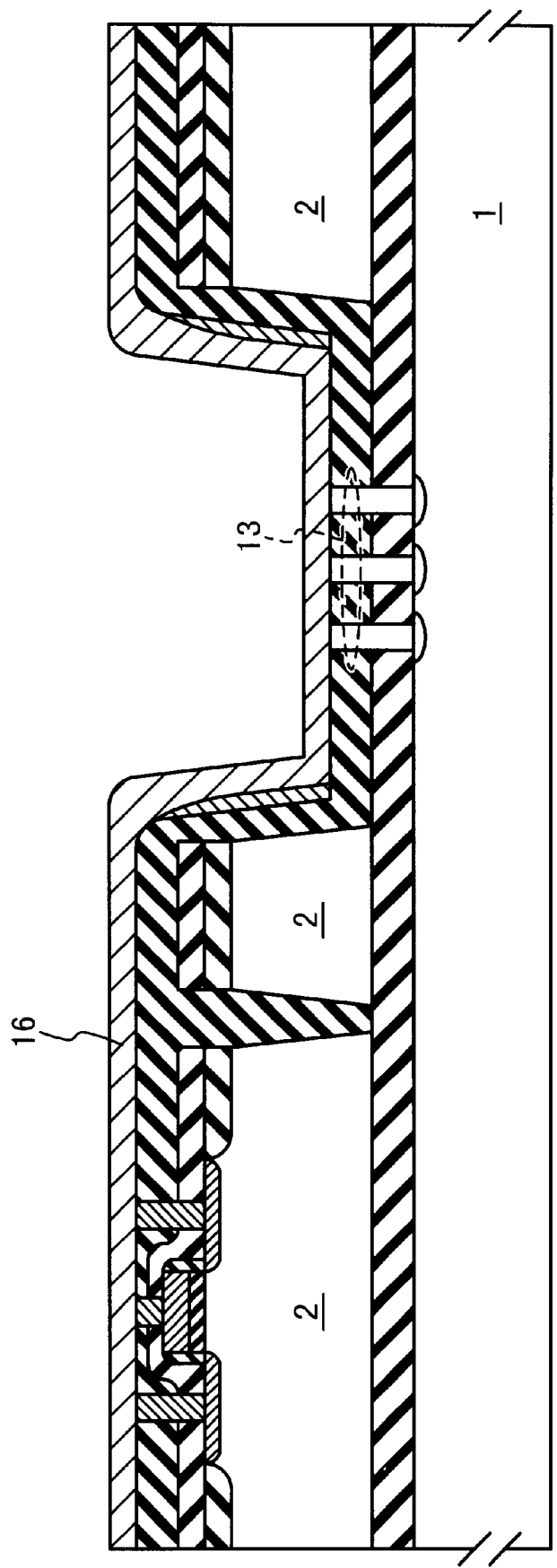

Next, as shown in FIG. 11E, at the wiring film depositing step S9, an Al layer is deposited with a predetermined thickness on the entire surface of the wafer 100 as the wiring conductive material.

Next, as shown in 12A, at the wiring forming step S10, a photo-resist 604 is coated on the entire surface of the wafer 100, and a reticle (not shown) having a predetermined wiring pattern is used to expose and develop. The Al layer in a region other than the wiring portion is removed by use of the known dry etching technique. Thus, the Al wiring 16G is formed as the support substrate connection wiring through to connect the silicon substrate 1 and the predetermined external connection electrode 200G. Also, the Al wirings 16 serving as desired inner connection wirings and the external connection electrodes 200 and 200G are formed.

Figure 12A:
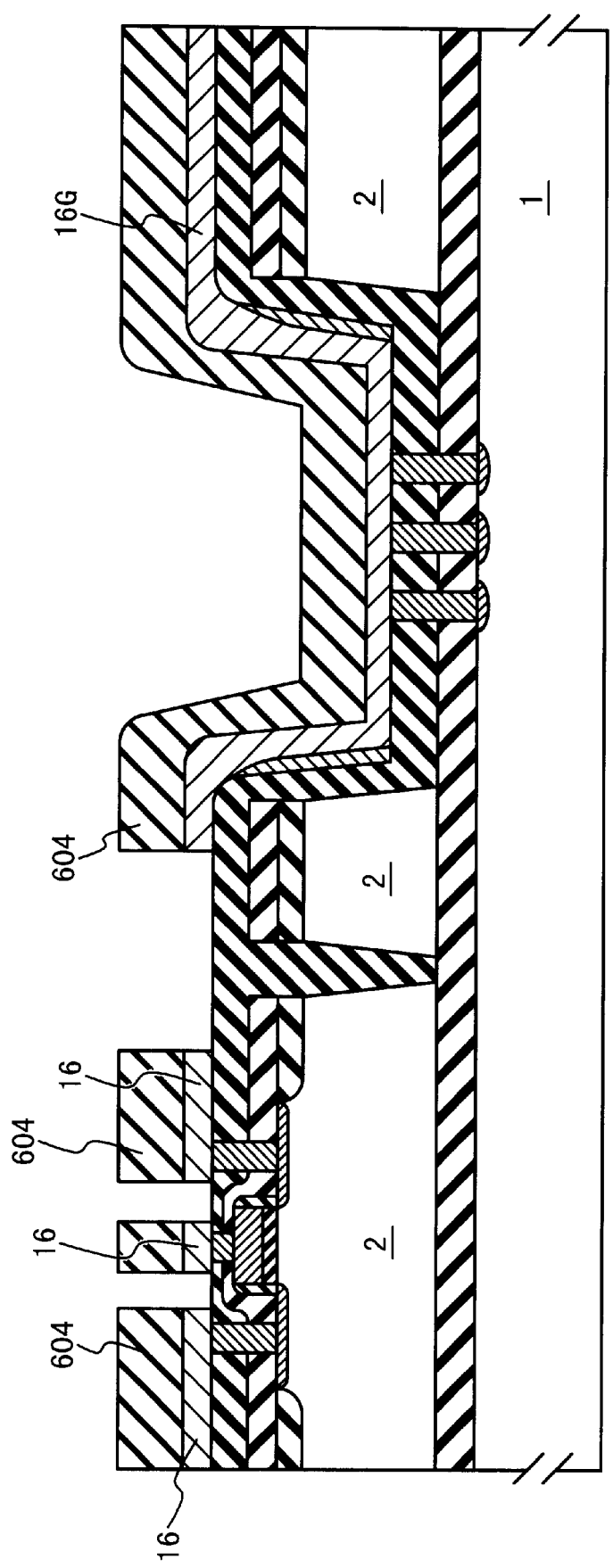
Figure 12B:
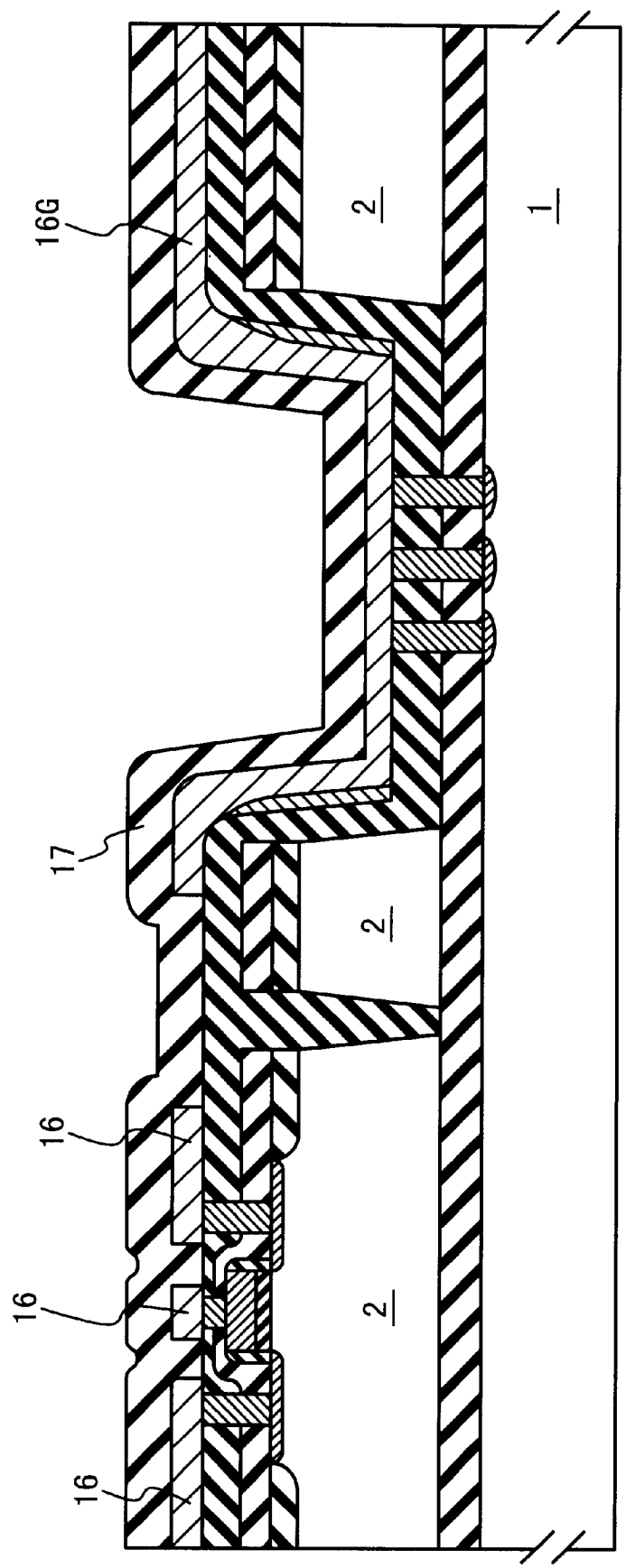
Figure 12C:
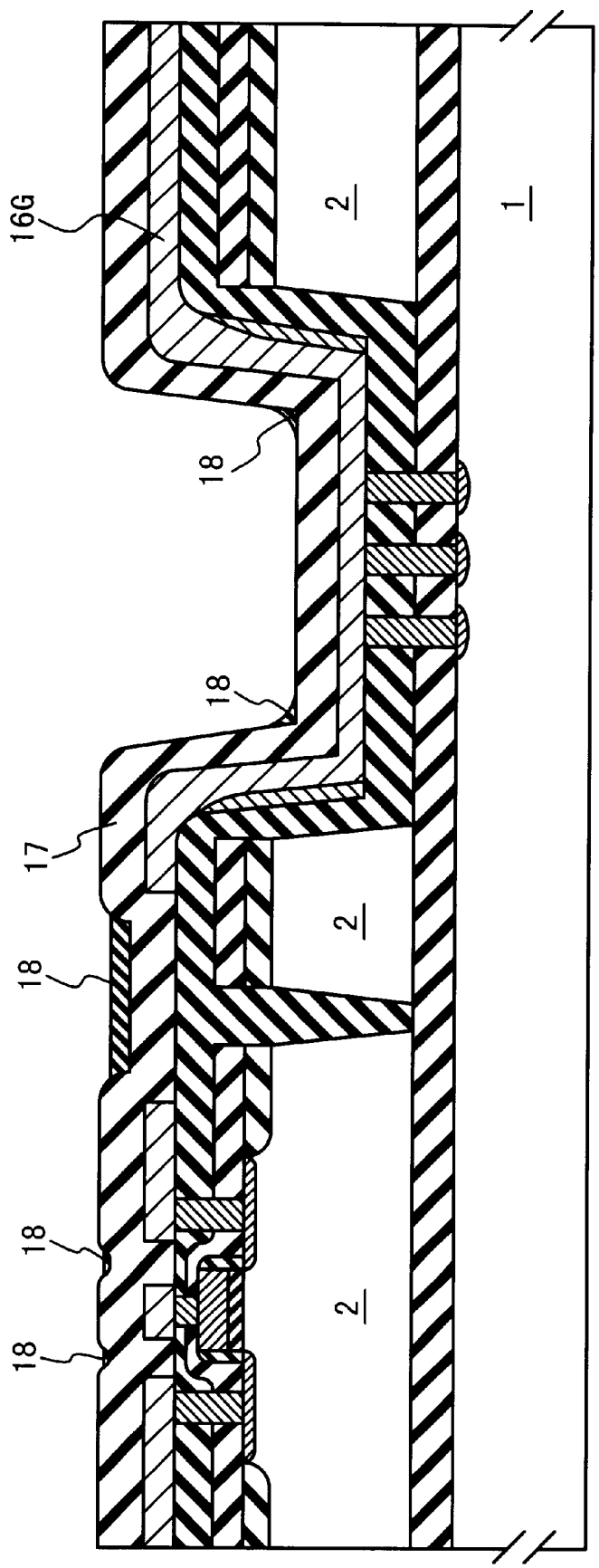
Figure 12D:
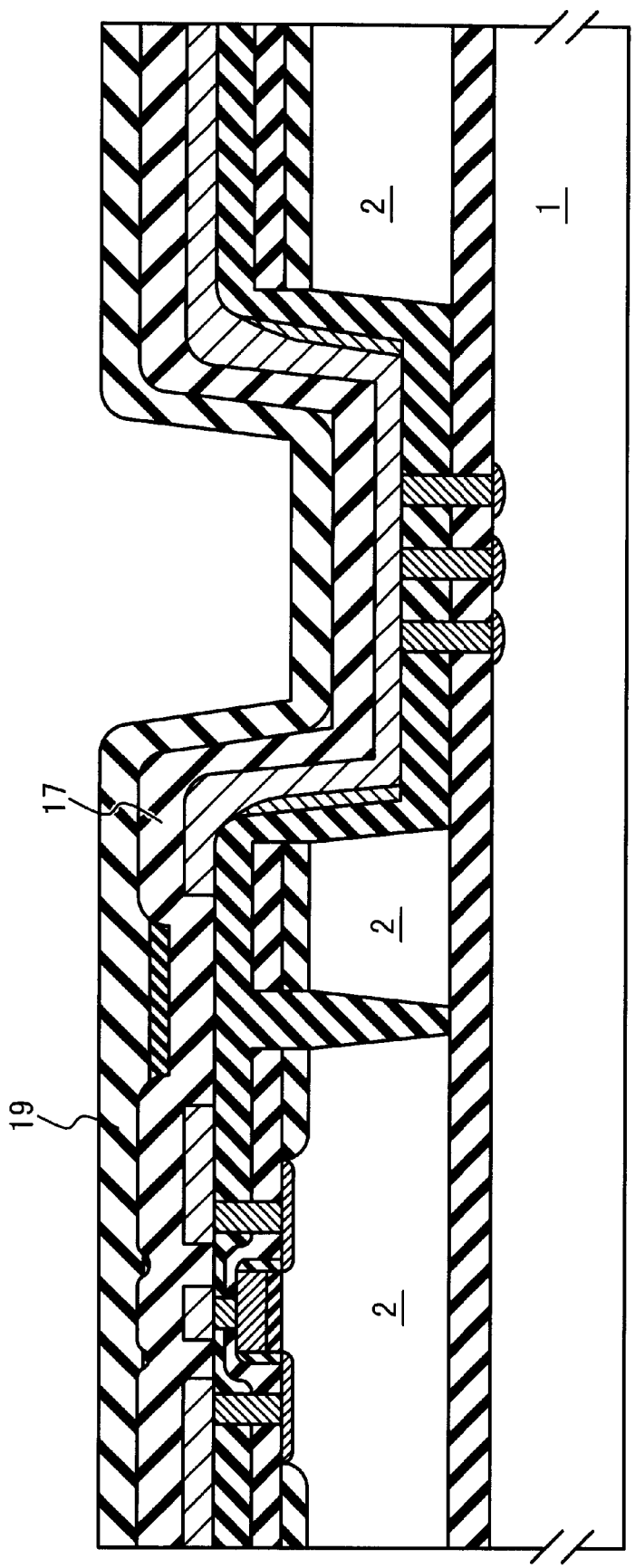
Figure 13:
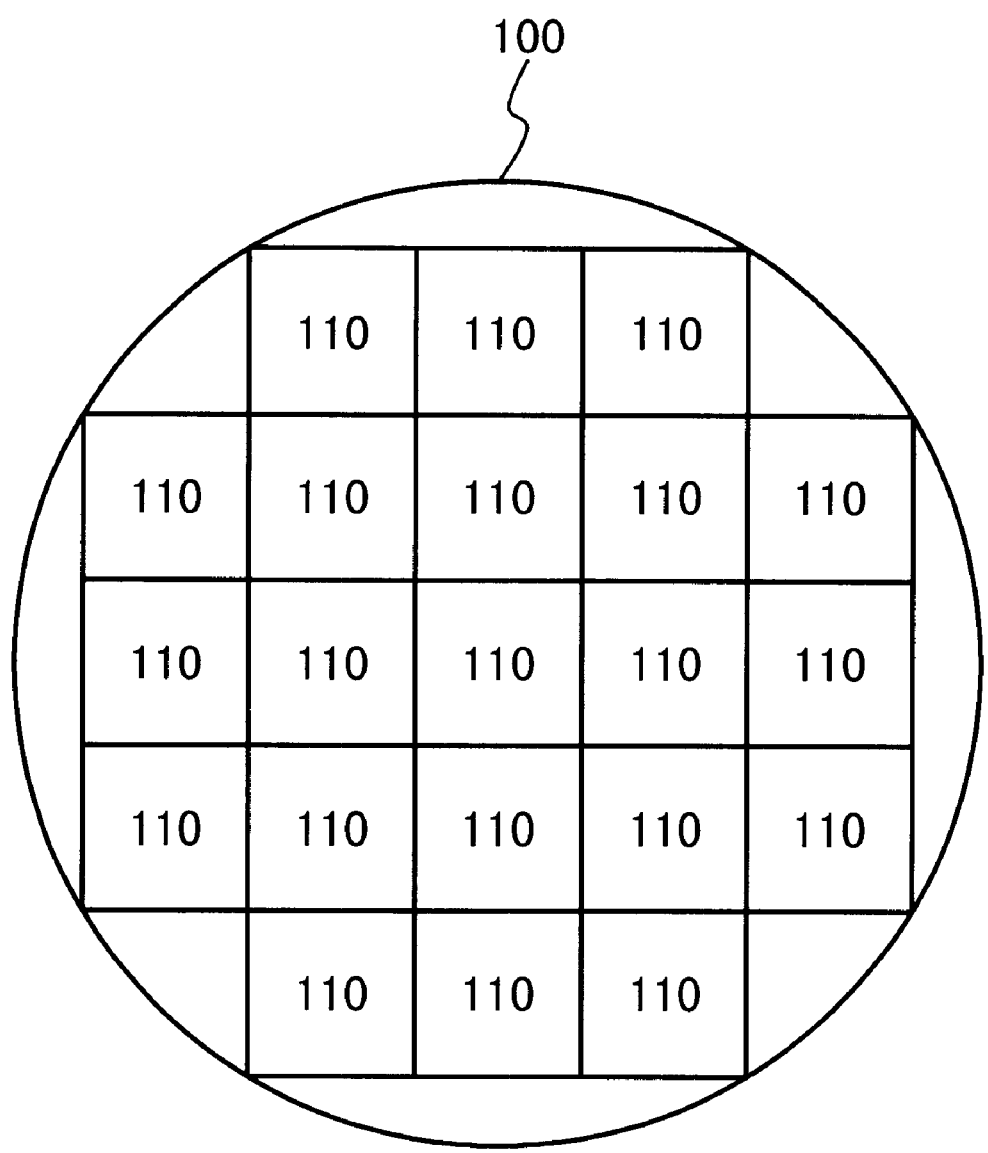
FIG. 13 is a plan view schematically showing a wafer.

Next, as shown in FIG. 12B, at the protective film forming step S11, the silicon oxide film for protecting the Al wirings 16 and 16G are deposited with the thickness of t1 on the entire surface of the wafer 100. In this case, desirably, 0.3 μm≦t1≦1 μm. Also, the protective oxide film 17 is formed. In succession, as shown in FIG. 12C, SOG (Spin On Glass) 18 is coated on it. After coated SOG is heated and hardened, the SOG film 18 is etched back on the entire surface until the protective oxide film 17 in the flattened portion is exposed. Thus, the concave and convex state on the surface is relaxed. Moreover, as shown in FIG. 12D, a silicon nitride film ($Si_3N_4$ film) is deposited with the thickness of t2. In this case, desirably, 0.1 μm≦t2≦0.5 μm. Thus, the protective nitride film 19 is formed. It should be noted that as the protective nitride film 19, it is possible to use a silicon oxide nitride film (SiON film). Then, the external connection electrodes 200 and 200G are opened by use of the known photo-lithography and etching techniques. Moreover, the bumps 201 are formed as necessary, and the wafer process is ended.

Figure 14:
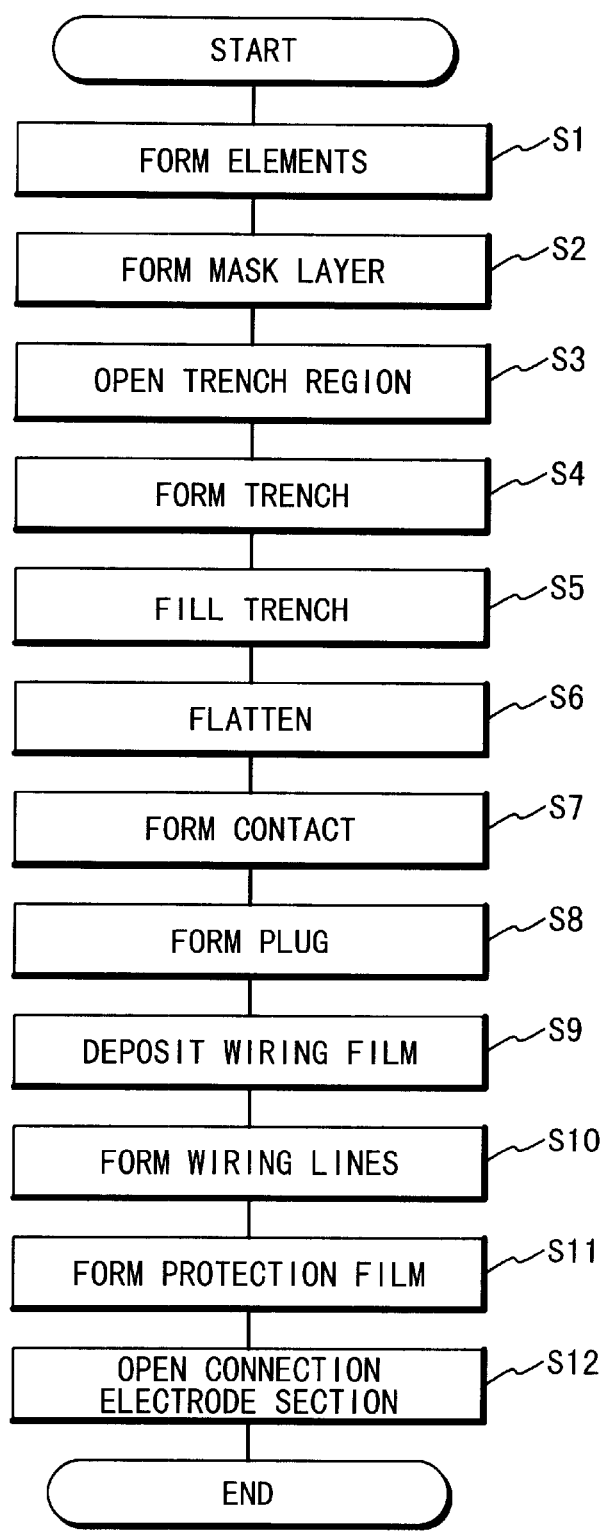
FIG. 14 is a schematic flowchart showing a modification of the method of manufacturing a semiconductor device in the first embodiment for a multiple-layer wiring structure.

When the chip 110 has the multi-layer wiring structure, the process from the element forming step S1 to the wiring forming step S10 are identical to those in the first embodiment, as shown in the schematic flowchart of FIG. 14. Although not shown again, after the wiring forming step, a multi-layer wiring forming step S61 is carried out by use of the known method of manufacturing the multi-layer wiring. Then, the protective film forming step S11 and the external connection electrode opening step S12 are carried out. The protective insulating film with a predetermined thickness is formed to protect the top layer wiring similarly to the first embodiment. Then, the external connection electrodes 200 and 200G are opened. Moreover, the bumps 201 are formed as necessary, and the wafer process is ended.

Figure 15:
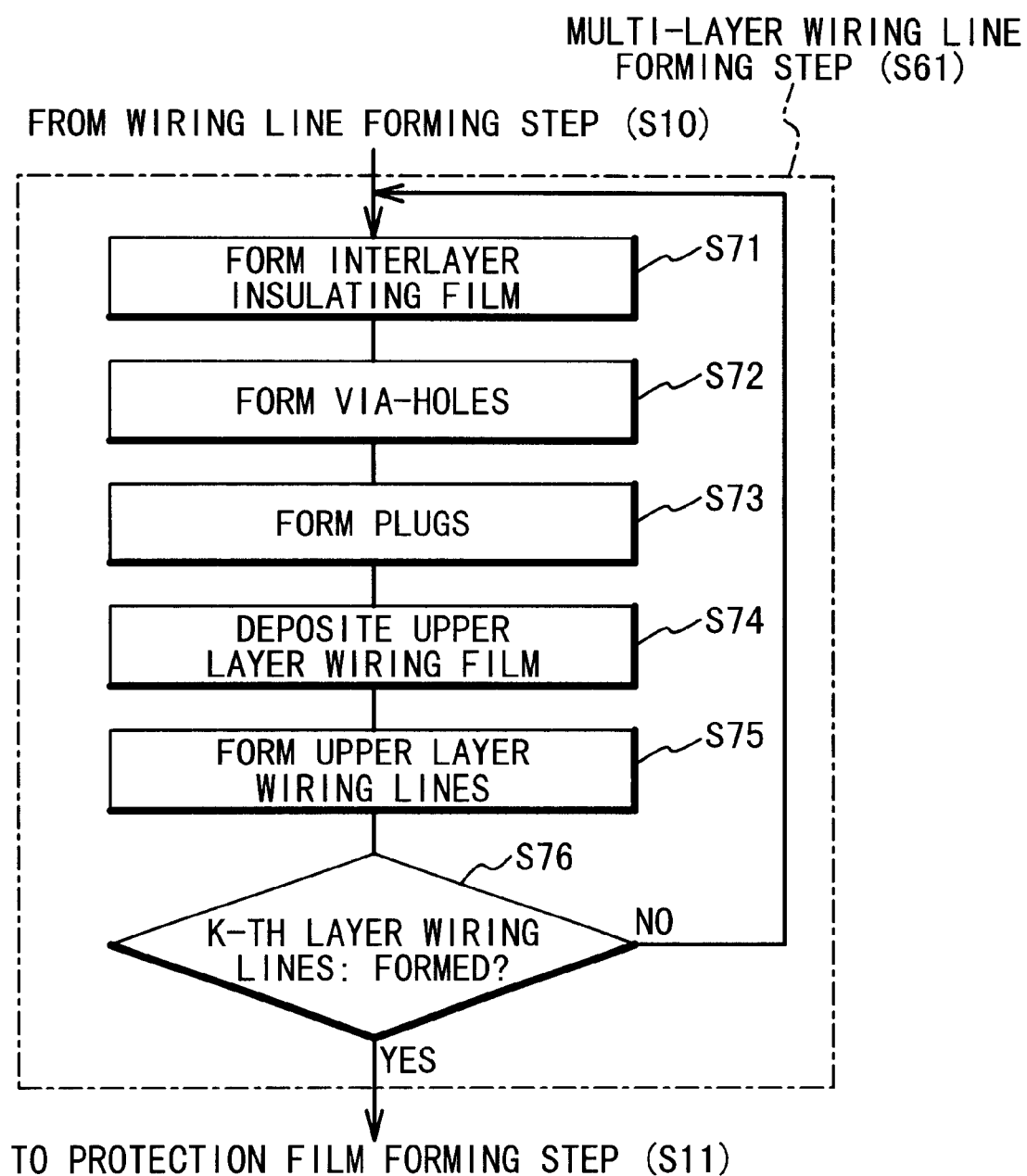
FIG. 15 is a detailed flowchart of a multiple-wiring structure forming step in FIG. 14.

It should be noted that as shown in FIG. 15, the multi-layer wiring forming step S61 is carried out by repeating the steps including an interlayer insulating film forming step S71, an interlayer via-hole forming step S72, a plug forming step S73 of filling a via-hole with metal, an upper layer wiring film depositing step S74 and an upper layer wiring forming step S75 for the necessary number of times, e.g., (k−1) times in a case of K layers.

After the wafer process is ended irrespectively of the one-layer wiring structure or the multi-layer wiring structure, the wafer 100 is cut out into the chips 110. Then, the chip is assembled to a desirable package to complete the semiconductor device.

As mentioned above, according to the method of manufacturing the semiconductor device in the first embodiment, when the separation trench 9 is formed for separating the element formation region 50, the substrate contact regions 10 are simultaneously formed. The substrate contact region 10 is set in the proper empty region within the chip 110. Also, when the separation trench 9 should be perfectly filled with the TEOS oxide film 11, the TEOS oxide film 11 is deposited with the same thickness in the flattened portion and the substrate contact region 10. Thus, the substrate contact region 10 has a sufficient size so that the contact region 10 is not fully filled. Thus, only by adding the first opening step, the contact hole 13 can be formed as the first contact hole for the connection to the silicon substrate 1 serving as the support substrate at the small resistance. Therefore, the semiconductor device can be manufactured which has the chip 110 in which the potential can be applied to the support substrate from the surface plane of the chip 110.

Figure 16A:
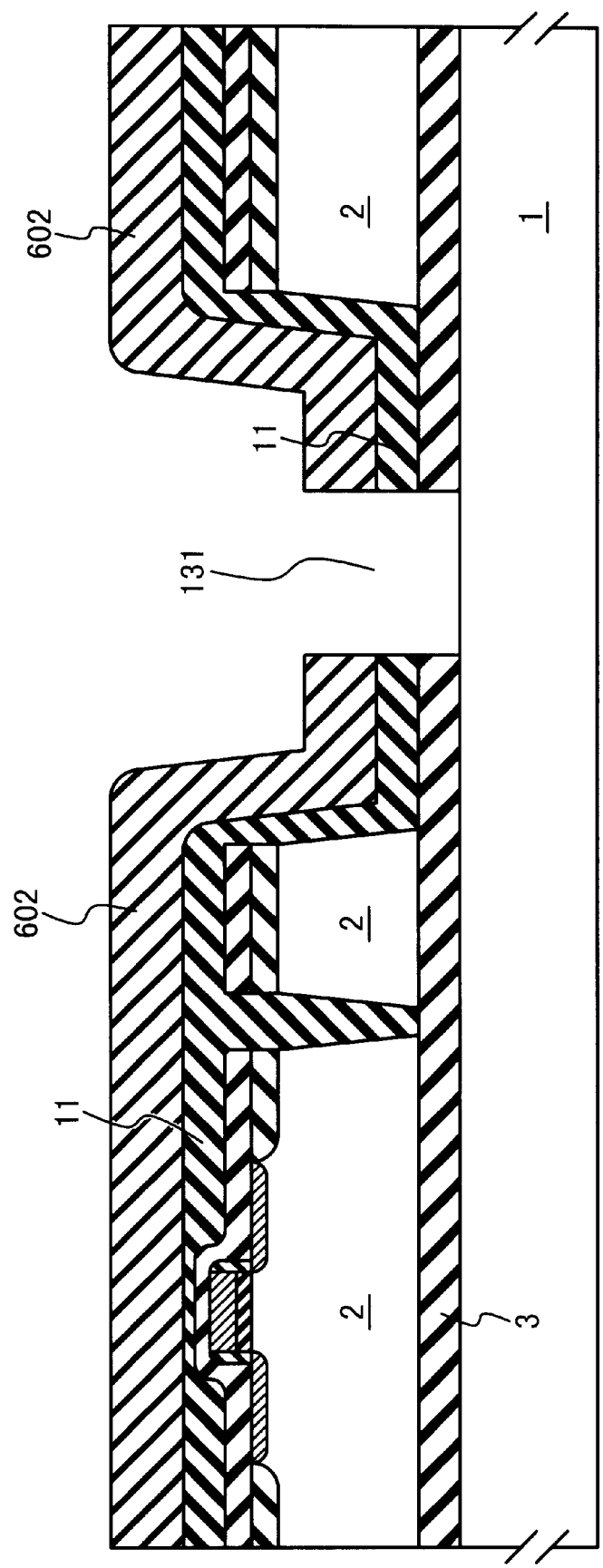
FIGS. 16A to 16D are sectional views showing the method of manufacturing a semiconductor device according to a second embodiment of the present invention along the A–B portion of FIG. 5.
Figure 16B:
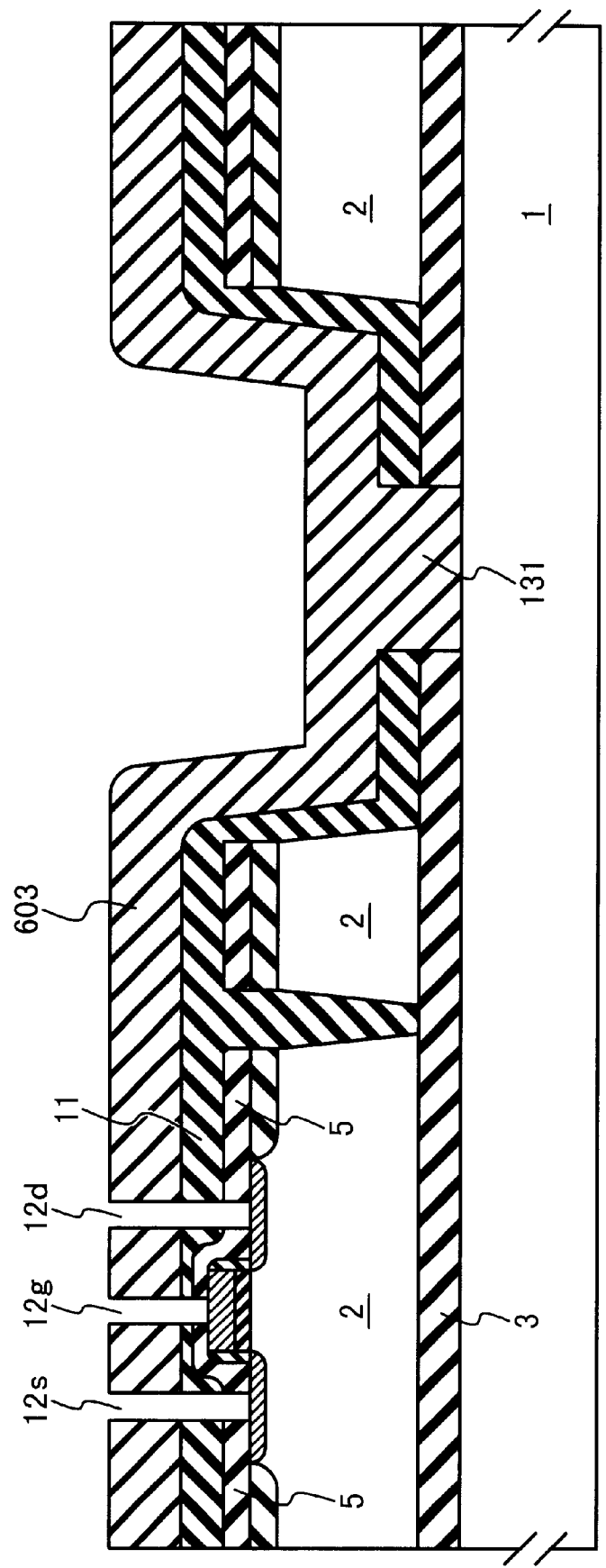
Figure 16C:
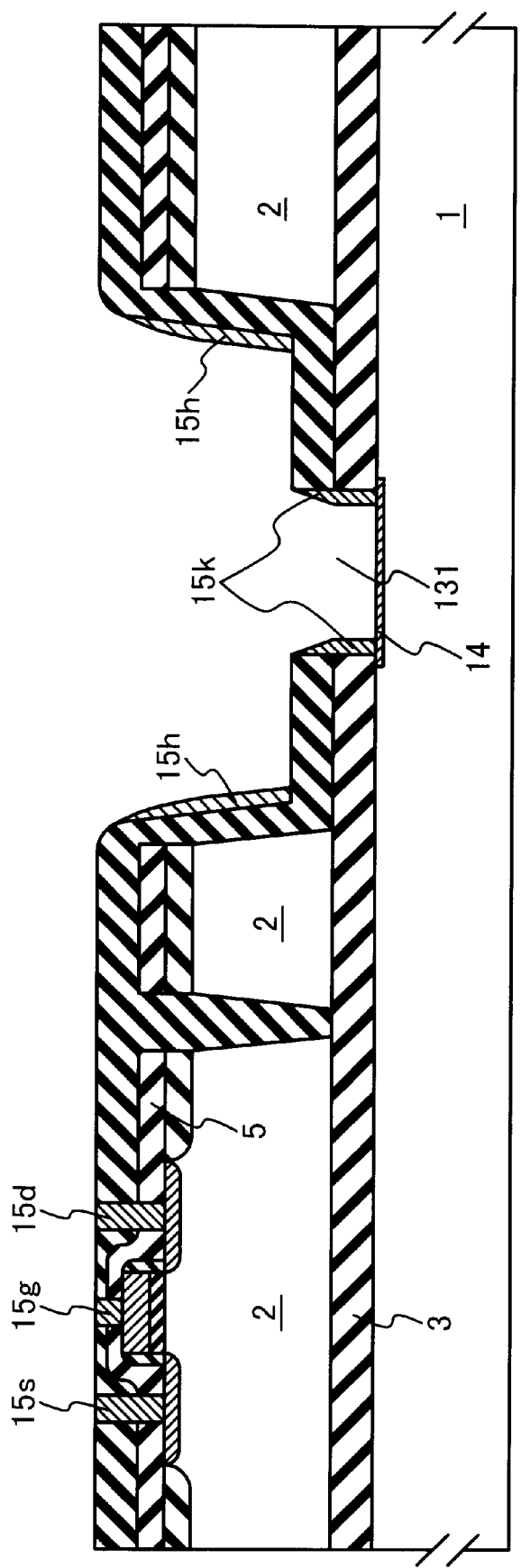
Figure 16D:
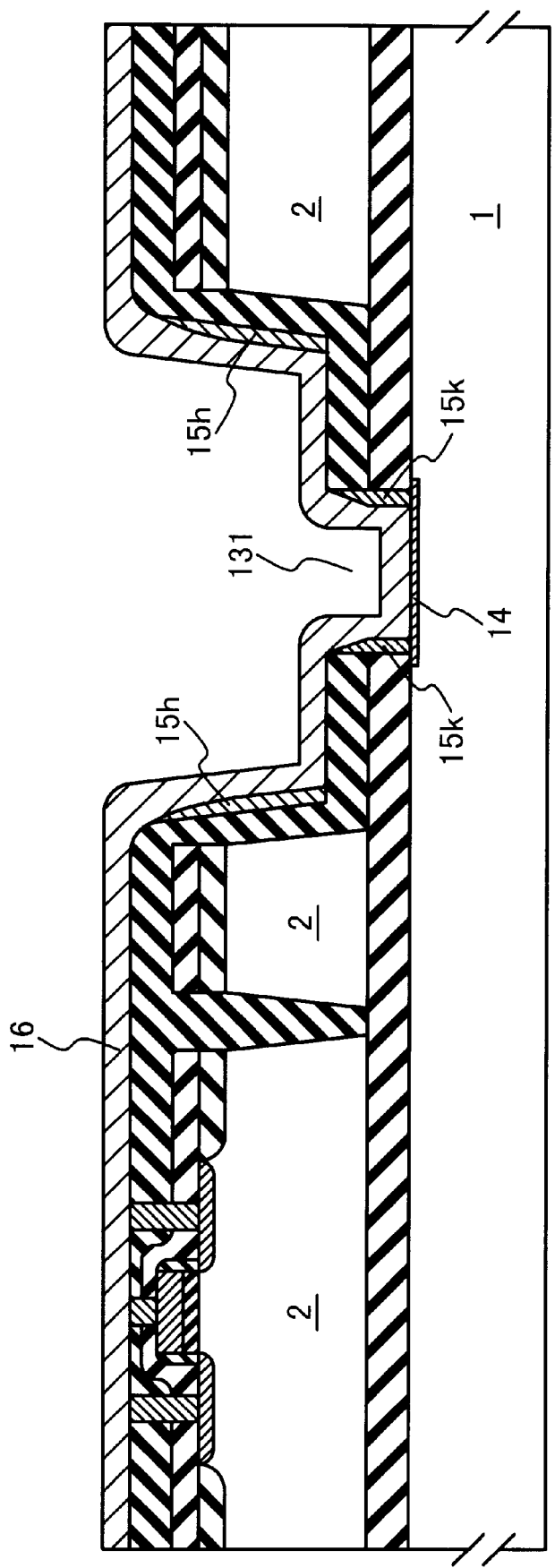

It should be noted that in the above-mentioned first embodiment, the first contact hole is described by use of the contact hole 13 having the multi-contact structure as the example. However, it may be the single contact structure. It should be noted that even if the first contact hole has the single contact structure, it is sufficient that only the pattern of the reticle used in the first opening step is changed. Also, the processed contents at the respective steps are perfectly identical to those of the manufacturing method of the first embodiment. Thus, the detailed explanations are omitted. FIGS. 16A to 16D are the sectional views for the respective steps until the wiring film depositing step S9 after the first opening step S40 of the contact step S7 when the first contact hole has the single contact structure, and correspond to FIGS. 11B to 11E. In the case, a contact hole 131 made in the first opening step S40 has a sufficiently large dimension such as about 2 μm×2 μm to 5 μm×5 μm. Thus, even if the contact hole 12 is perfectly filled with the tungsten at the plug forming step S8, the contact hole 13 is not filled. The tungsten having the film thickness equal to that of the tungsten deposited on the flattened portion is only deposited on the bottom. Therefore, if the etch-back operation is performed to remove the tungsten layer in the flattened portion, the tungsten layer in the bottom of the contact hole 131 is also removed so that only the tungsten 15k remains on the side wall (FIG. 16C). However, the tungsten 15k remaining on the side wall effectively functions to protect the step disconnection of the wiring 16G in the contact hole 131. Thus, the connection is made surer.

Next, a method of manufacturing a semiconductor device according to the second embodiment of the present invention will be described below with the above-mentioned chip manufacturing method as the target.

Figure 17:
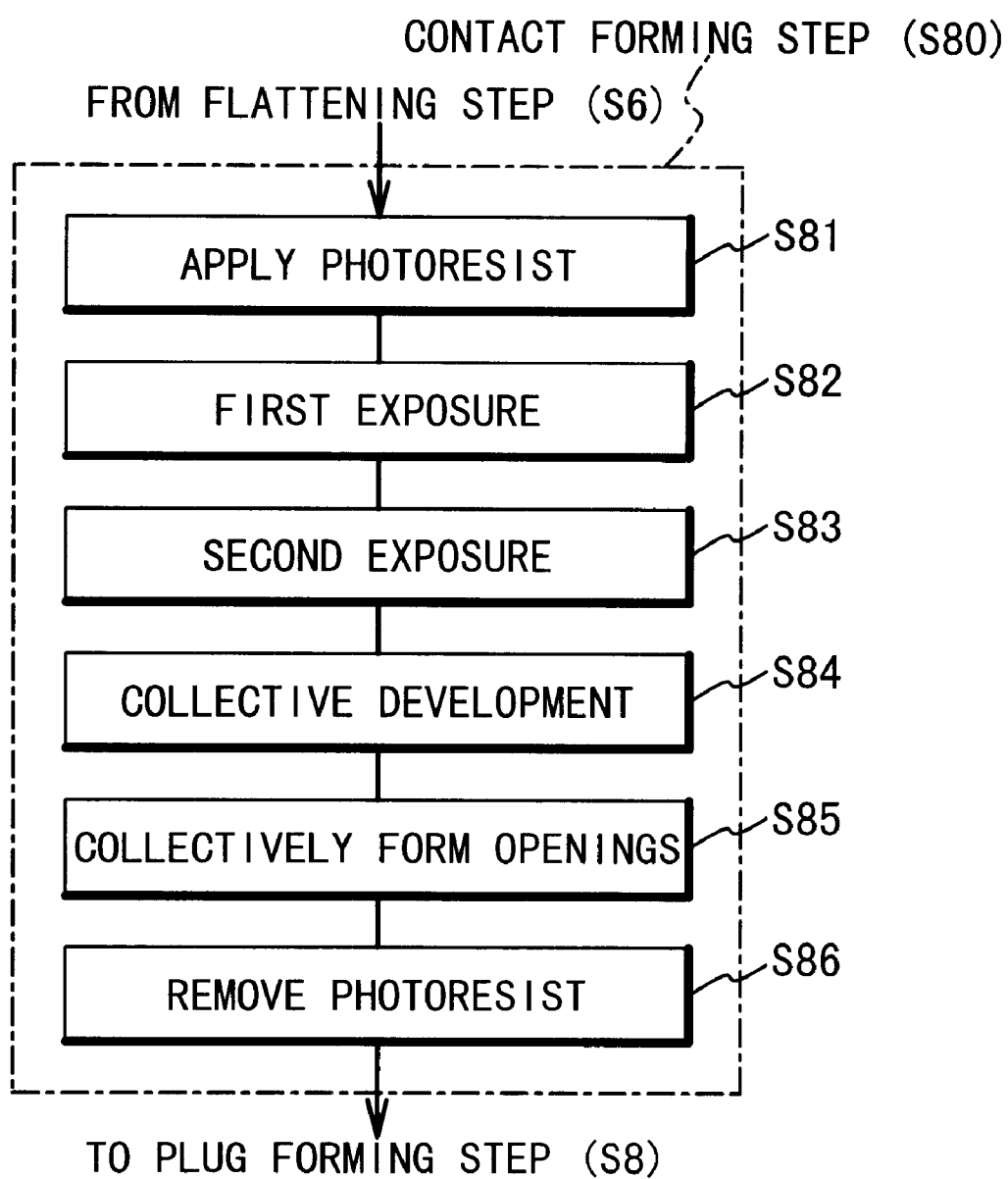
FIG. 17 is a schematic flowchart showing a manufacturing process of a single-layer wiring structure in the method of manufacturing a semiconductor device according to a second embodiment of the present invention.

The schematic flowchart of the method of manufacturing the semiconductor device in the second embodiment is similar to that of the first embodiment shown in FIG. 8. However, it is different in the detailed portion of the contact step S7. FIG. 17 hows the detailed flowchart of the contact step S7 included in the manufacturing method of the second embodiment. With reference to FIG. 17, the contact step S80 has a photo-resist coating step S81, a first exposing step S82, a second exposing step S83, a collectively developing step S84, a collectively opening step S85, and a photoresist removing step S86.

Figure 18A:
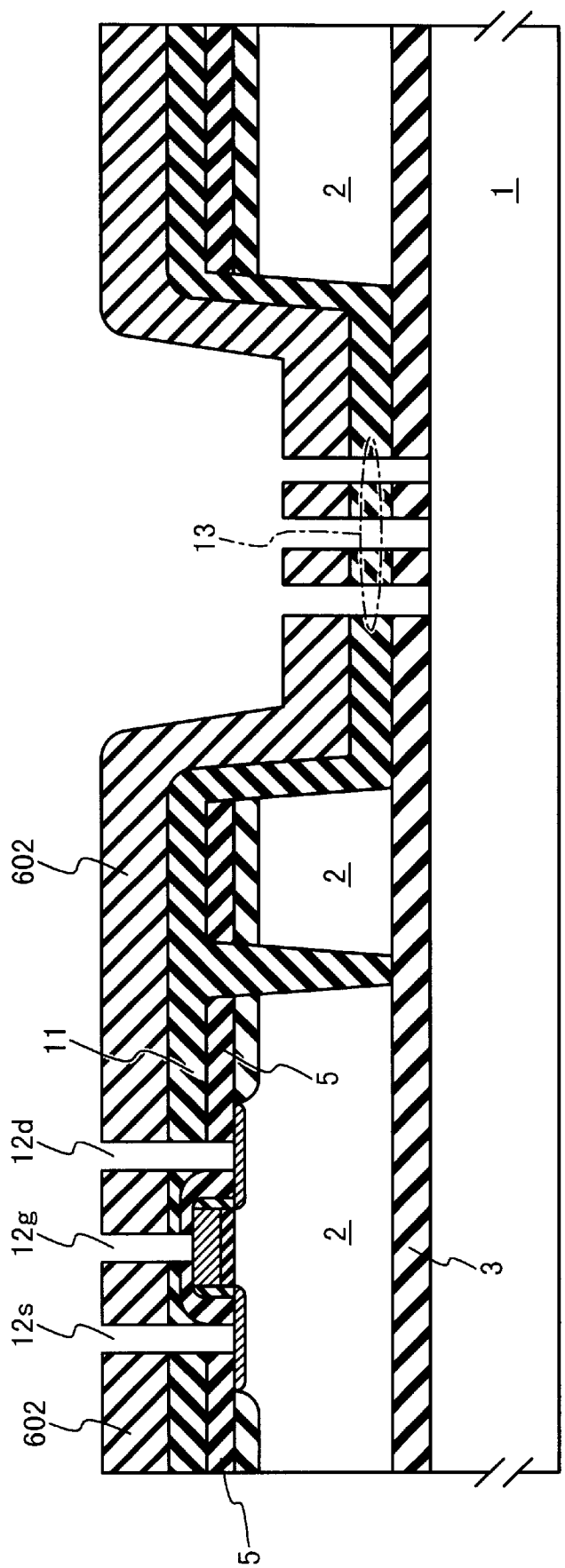
FIGS. 18A and 18B are sectional views schematically showing a main portion of the semiconductor device according to the second embodiment of the present invention along the A–B line of FIG. 5 in the contact step.
Figure 18B:
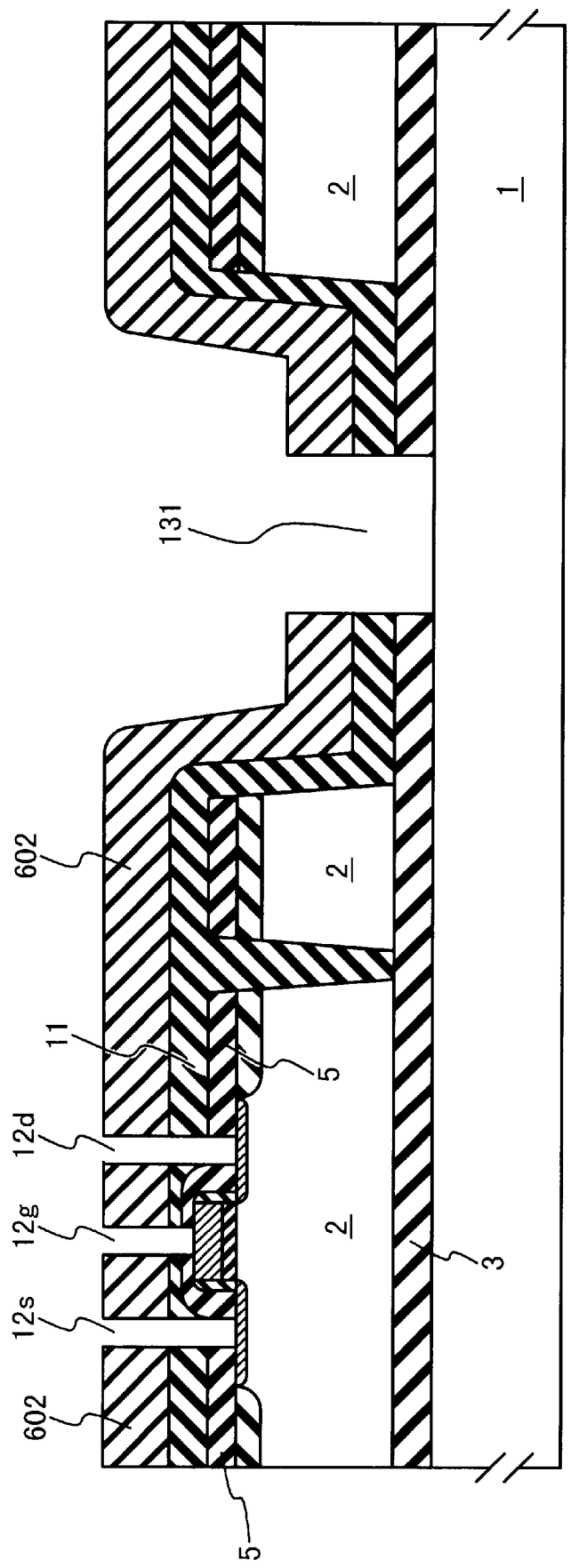

FIGS. 18A and 18B are diagrams describing the contact step S80 in the second embodiment, and are the sectional views schematically showing the main portion of the semiconductor device along the A–B line of FIG. 5. It should be noted that the other steps in the second embodiment are equal to those of the first embodiment, as mentioned above. Thus, the description of the steps other than the contact step S80 is omitted.

With reference to FIG. 17 and FIGS. 18A and 18B, in the contact step S7 in the second embodiment, at the photo-resist coating step S81, the photo-resist 602 is coated on the entire surface of the wafer 100 after the flattening step S6. At the first exposing step S82, the reticle (not shown) having the pattern of the contact hole 13 as the predetermined first contact hole is used for exposure. In succession, at the second exposing step S83, the reticle (not shown) having the pattern of the contact hole 12 as the second contact hole is used for exposure. Then, at the collectively developing step S84, these patterns are developed to collectively form the patterns of the contact hole 12 and the contact hole 13. At the collectively opening step S85, the TEOS oxide film 11, the silicon oxide film 5 and the silicon oxide film 3 are etched and removed to thereby open the contact holes 12 and 13, as shown in FIG. 18A. Also, in the second embodiment, as shown in FIG. 18B, similarly to the case of the first embodiment, it is naturally allowable to use the first contact hole as the pattern of the contact hole 131 having the single contact structure. Also, any of the first exposing step S82 and the second exposing step S83 may be firstly carried out.

According to the method of manufacturing the semiconductor device in the second embodiment, when the separation trench 9 is formed for separating the element formation region 50, the substrate contact region 10 is simultaneously formed in the proper empty region within the chip 110. Also, when the separation trench 9 is perfectly filled with the TEOS oxide film 11, the TEOS oxide film 11 has the same thickness as that of the TEOS oxide film 11 on the flattened portion. Thus, the substrate contact region 10 is formed to have a sufficient size so as not to be filled. Thus, the first and second exposing steps S82 and S83 are only added for exposing the pattern of the contact hole 131 or the contact hole 13 as the first contact hole for the connection to the silicon substrate 1 as the support substrate. In this way, the semiconductor device can be manufactured which has the chip 110 in which the potential can be applied to the support substrate in the small resistance from the surface plane of the chip where the desired elements are formed.

Next, a method of manufacturing a semiconductor device according to the third embodiment of the present invention will be also described below with the above-mentioned chip manufacturing method as the target.

Figure 19:
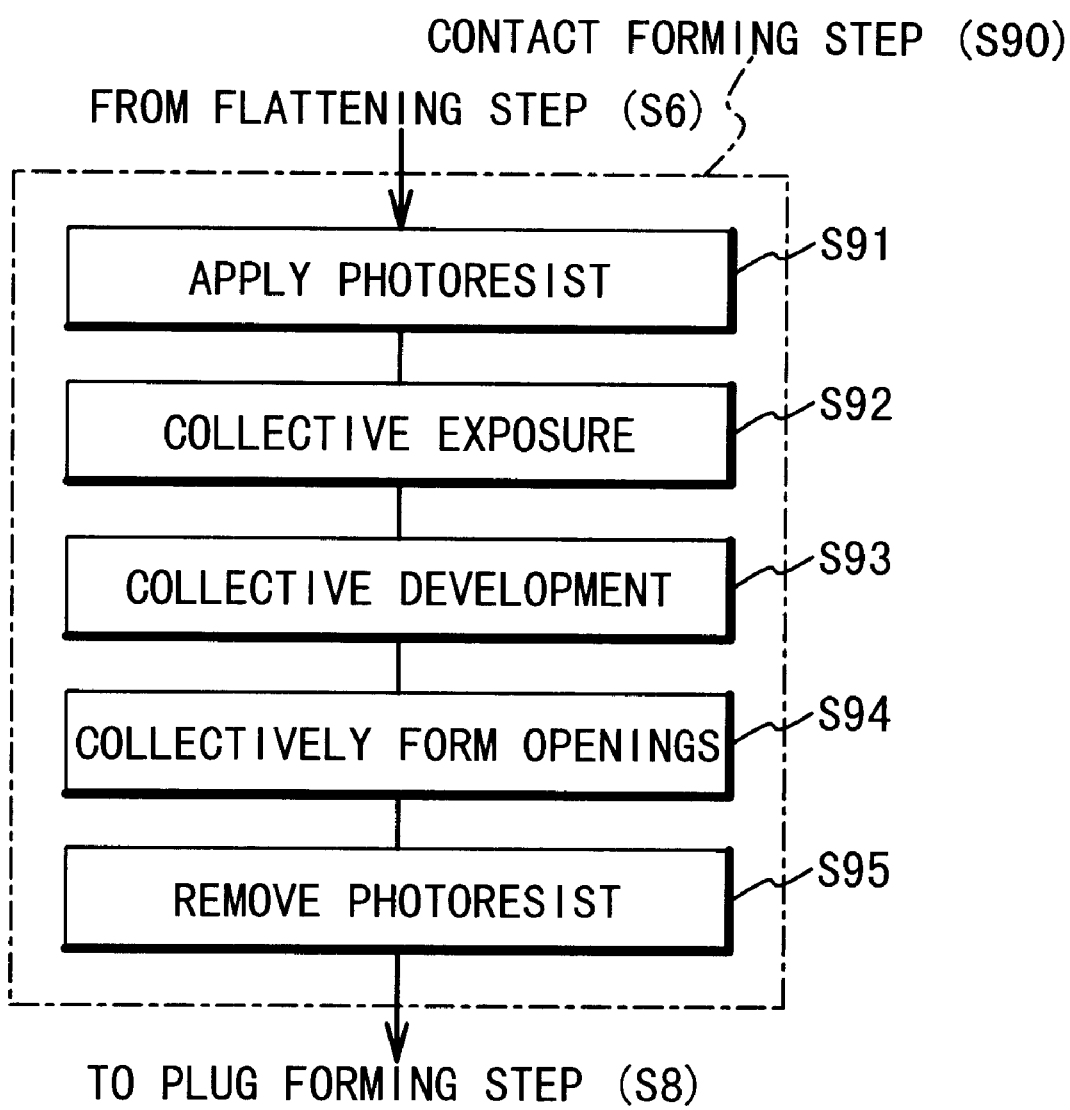
FIG. 19 is a detailed flowchart of the contact step in the method of manufacturing a semiconductor device according to a third embodiment of the present invention.

The schematic flowchart of the method of manufacturing the semiconductor device in the third embodiment is also similar to that of the first embodiment shown in FIG. 8. However, it is also different in the detailed portion of the contact step S7. FIG. 19 shows the detailed flowchart of the contact step S7 included in the manufacturing method of the third embodiment. With reference to FIG. 19, the contact step S7 (S90) has a photo-resist coating step S91, a collectively exposing step S92, a collectively developing step S93, a collectively opening step S94, and a photoresist removing step S95.

Figure 2:
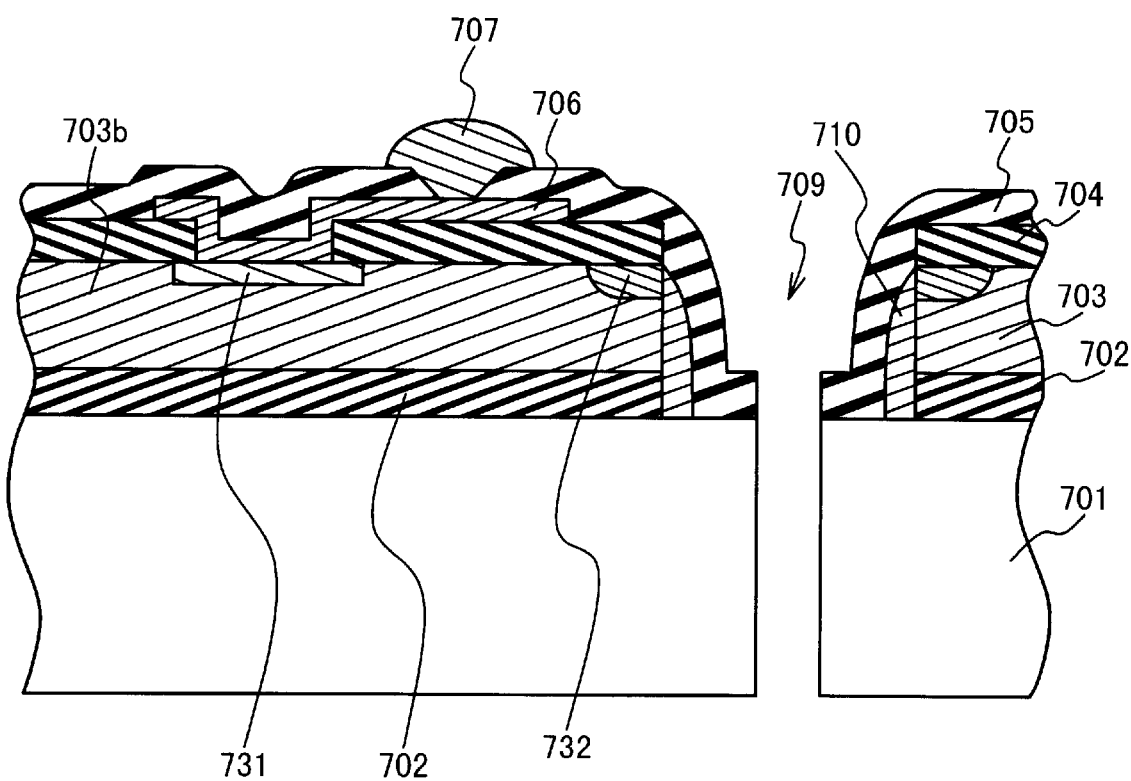
FIG. 2 is a sectional view showing a conventional example of an SOI semiconductor device in which a potential can be applied from a surface of an element to a support substrate.
Figure 3:
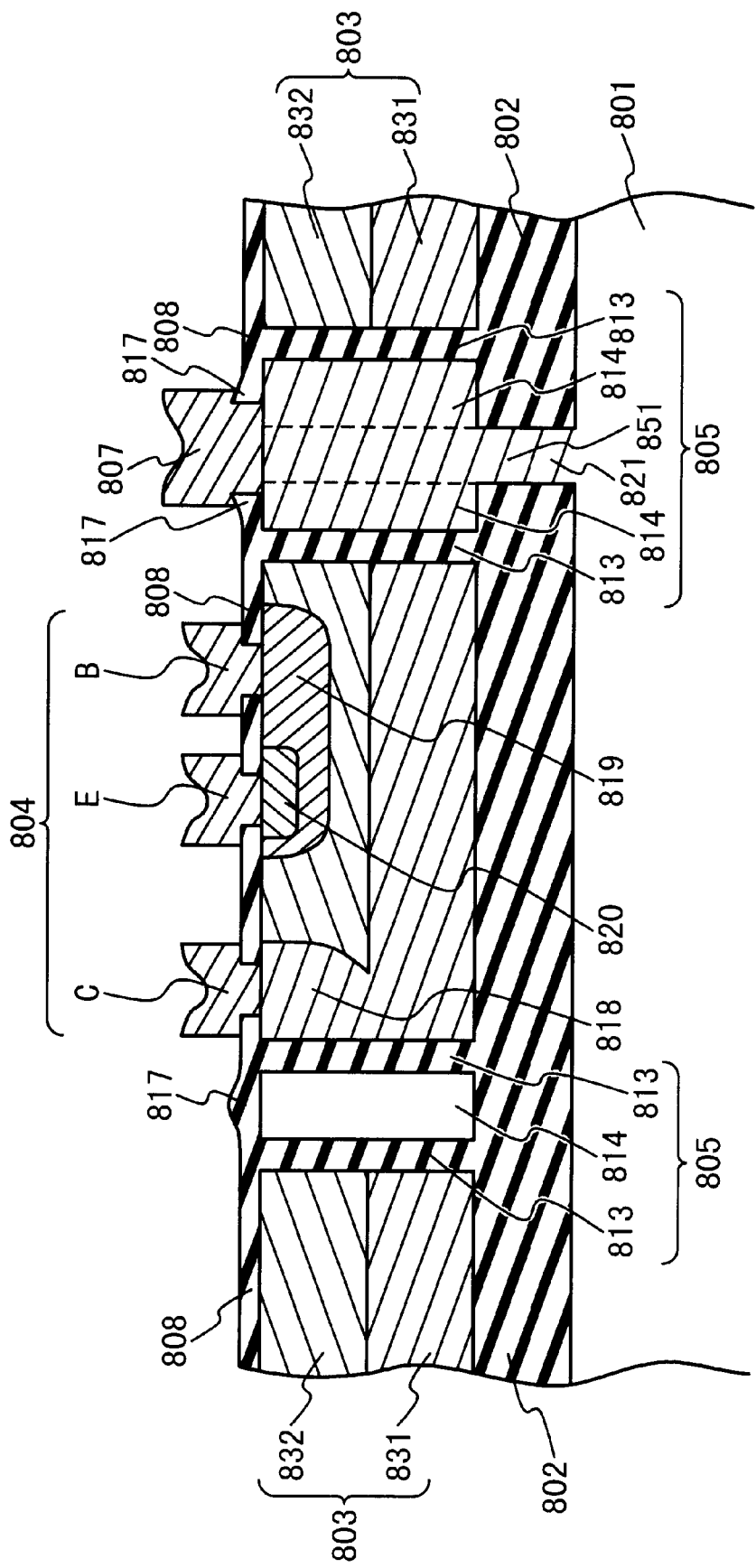
FIG. 3 is a sectional view showing a main portion of a conventional example 2 of a semiconductor device.
Figure 20:
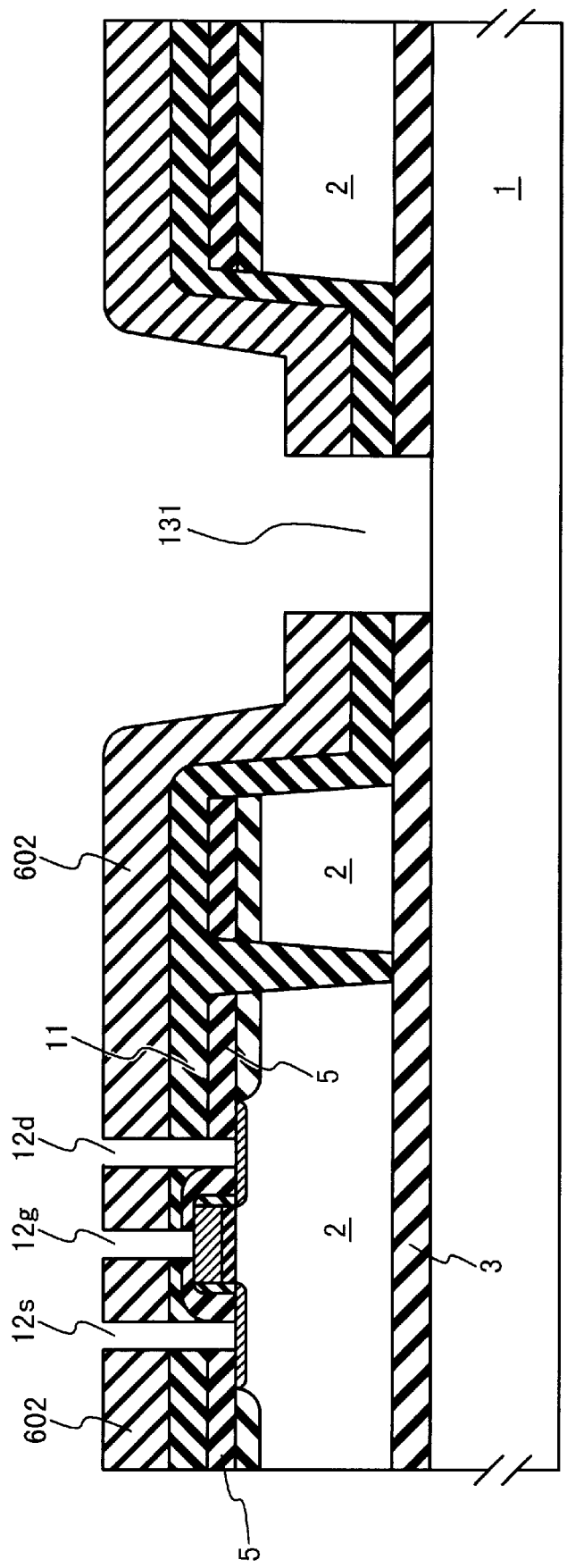
FIG. 20 is a sectional view schematically showing a main portion of the semiconductor device in the third embodiment along the A–B portion of FIG. 5

FIG. 20 is a view showing the contact step S90 in the third embodiment, and is a sectional view schematically showing the main portion of the semiconductor device along the A–B line of FIG. 2. It should be noted that the other steps in the third embodiment are equal to those of the first embodiment, as mentioned above. Therefore, the description of the steps other than the contact step S90 is omitted. With reference to FIG. 19 and 20, in the contact step S90 in the third embodiment, at the photo-resist coating step S91, the photo-resist 602 is coated on the entire surface of the wafer 100 after the flattening step S6. At the collectively exposing step S92, the reticle (not shown) having both the patterns for the contact hole 131 and the contact hole 12 are used to expose. Then, at the collectively developing step S93, these patterns are developed to collectively form the patterns of the contact hole 131 and the contact hole 12. At the collectively opening step S94, the TEOS oxide film 11, the silicon oxide film 5 and the silicon oxide film 3 are etched and removed to thereby open the contact holes 12 and 131. In the case, there is the large step difference between the pattern formation surface of the contact hole 131 as the first contact hole and the pattern formation surface of the contact hole 12 as the second contact hole. Thus, there is a problem that if a resolution of one pattern is at an optimal condition, a resolution of the other pattern is deteriorated. Therefore, at least one contact hole 131 having a size suitable for the first contact hole is included. FIG. 20 shows the single contact structure of the contact hole 131 as the example. In this case, the pattern of the contact hole 131 can be sufficiently resolved, even if the exposure is carried out when the resolution of the pattern of the contact hole 12 requiring the high resolution is at the optimal condition at the time of the pattern exposure.

According to the method of manufacturing the semiconductor device in the third embodiment, the separation trench 9 is formed for separating the element formation region 50. At this time, the substrate contact region 10 is simultaneously formed in the proper empty region within the chip 110. Also, when the separation trench 9 is perfectly filled with the TEOS oxide film 11, the film thickness of the TEOS oxide film 11 in the contact hole is same as that of the TEOS oxide film 11 on the flattened portion. Thus, the substrate contact region 10 is formed to have a sufficient size so as not to be filled. Thus, at least one contact hole is included to have a proper size (usually, 2 μm×2 μm to 5 μm×59 μm) as the first contact hole for the connection to the silicon substrate 1 as the support substrate. In this case, the first contact hole can be exposed, developed and opened simultaneously with the second contact hole for the connection to the element formed in the element formation region 50. Therefore, without any additional step, the semiconductor device can be manufactured to have the chip 110 in which the potential can be applied to the support substrate in the small resistance from the surface plane of the chip where the desired elements are formed.

It should be noted that the semiconductor device in the present invention and the method of manufacturing the same are not limited to the description of the above-mentioned embodiments. Therefore, the various modifications can be made thereto without departing from the spirit and scope of the present invention. For example, when the silicon substrate is used as the support substrate, its conductive type may be any of the P-type or the N-type if the resistivity is 1 to 50 Ωcm and the thickness is 600 to 700 μm. Also, even when it is not the silicon substrate, the proper material can be selected and used if it is electrically conductive and has no problem with regard to the manufacturing process. As the semiconductor substrate 2, the silicon is desirable which contains the single crystal layer having the resistivity of 10 to 20 Ωcm and the thickness of 2 to 10 μm. However, it is not limited thereto. As the first insulating film 3, if the silicon substrate is used as the support substrate, the silicon oxide film is desired to have the thickness of 0.5 μm to 2 μm. Also, the substrate contact region 10 may be suitably determined depending on the size of the empty region of the chip 110, in the range between about 5 μm×5 μm and 100 μm×100 μm. Also, at the plug forming step, tungsten is described as the example of the fill metal. However, if a high temperature sputtering method in which a substrate temperature is set at about 500° C. is used, Al can be also used as the fill metal. Moreover, the metal for the wiring is not limited to the above-mentioned Al. Silicon inclusion aluminum (AlSi), copper inclusion aluminum (AlCu), copper and silicon inclusion aluminum (AlSiCu) and the like can be used.

In the above-mentioned embodiments, the example is described in which after the element forming step is firstly carried out to form the desirable element, the trench region opening step and the trench forming step are carried out to form the separation trench 9 and the substrate contact region 10. However, it is possible to form the desirable element in the element formation region 50 after the separation trench 9 and the substrate contact region 10 are firstly formed to fill the separation trench 9.

Figure 21:
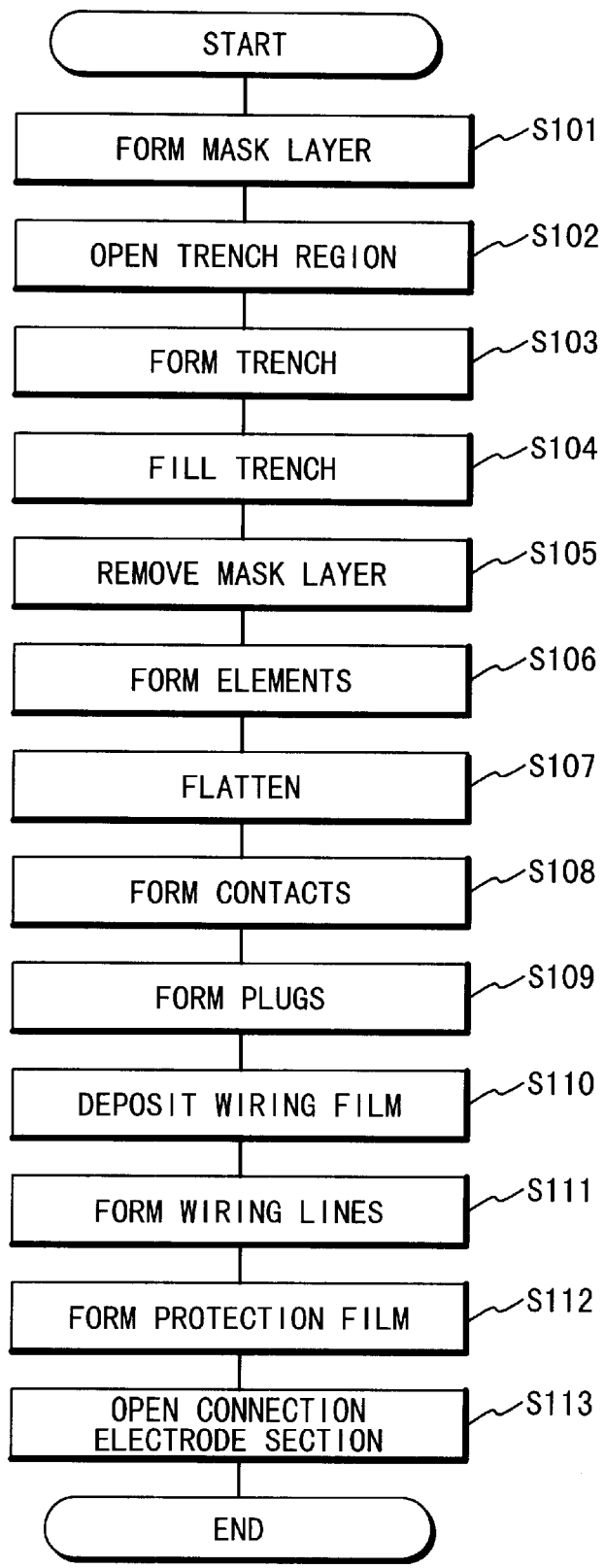
FIG. 21 is a flowchart showing a method of manufacturing a semiconductor device according to a fourth embodiment of the present invention.

FIG. 21 is a flowchart showing an example of a procedure when the separation trench 9 and the substrate contact region 10 are firstly formed. FIGS. 22A to 22D, FIGS. 23A to 23C, and FIGS. 24A to 24D are views showing a chip manufacturing method along the flowchart of FIG. 21, and are the sectional views schematically showing the main portion of the semiconductor device along the A–B line of FIG. 2 at the main steps (however, until the plug forming step).

Figure 22A:
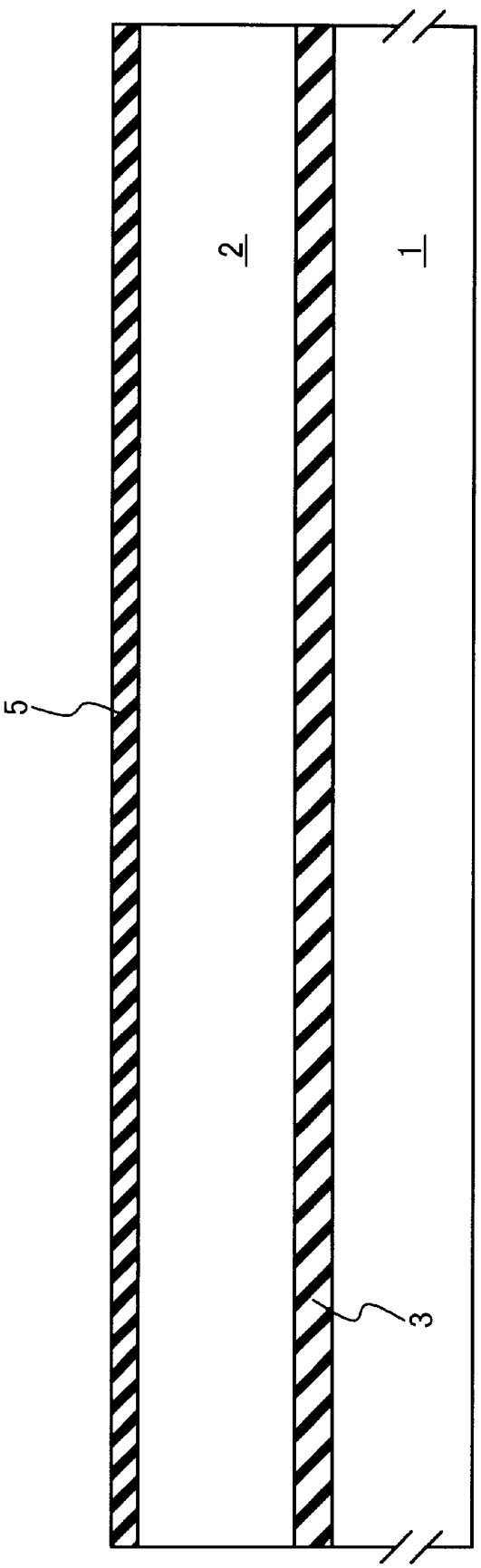

As shown in FIG. 22A, a silicon oxide film 3 and a P-type silicon substrate 2 are laminated or bonded in this order on one main surface of The P-type silicon substrate 1. The silicon oxide film 3 serving as a first insulating film has the film thickness of about 1 μm, and the P-type silicon substrate 2 has the resistivity of 10 Ωcm and the thickness of 5 μm. The P-type silicon substrate 1 has the resistivity of 10 Ωcm and the thickness of 650 μm. Then, the separation trench is firstly formed. Next, at a mask layer forming step S101, an silicon oxide film 5 is deposited with the thickness of about 0.5 μm by use of the CVD method, on the entire surface of the wafer 100 having a diameter of 6 inches.

As shown in FIG. 22B, at a trench region opening step S102, a photo-resist 601 is coated on the entire surface of the wafer 100. Then, predetermined reticle (not shown) is used to expose and develop, which forms a pattern for a separation trench formation opening 7 having a width h and a pattern for a substrate contact region formation opening 8, in order to separate an element formation region. Moreover, the silicon oxide films 5 are removed portions for the openings 7 and 8 by use of the known etching technique. Thus, the silicon substrate 2 is exposed.

Figure 22C:
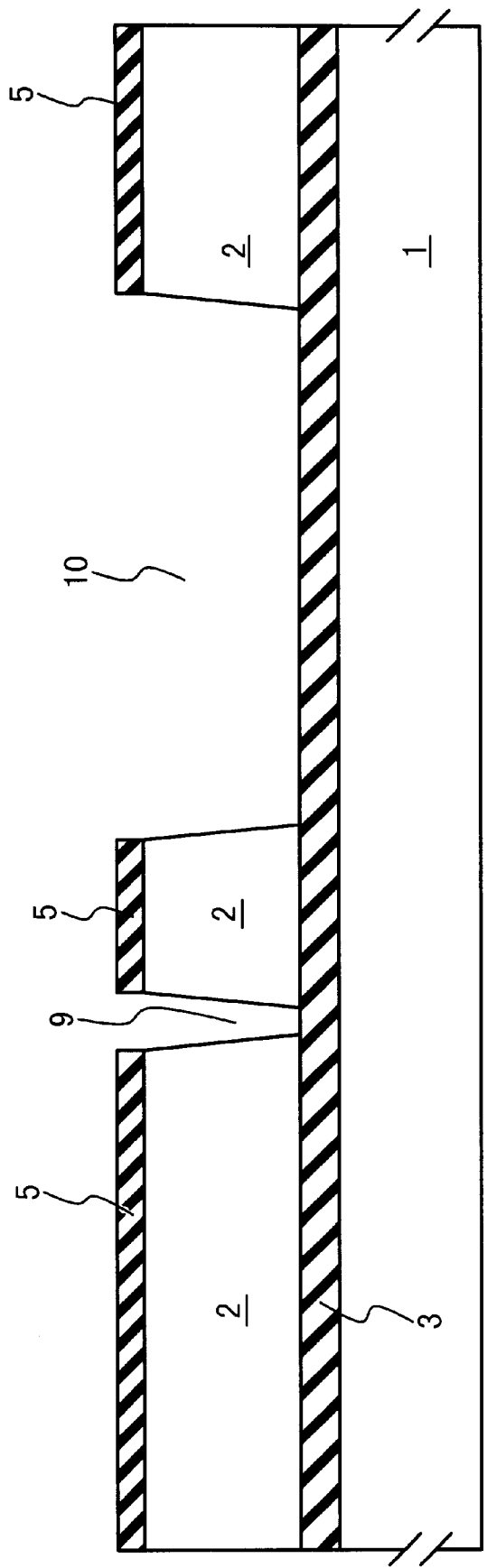

Next, as shown in FIG. 22C, the photo-resist 601 is removed. Then, at a trench forming step S103, the silicon oxide film 5 is used as the etching mask, and the portion in which the silicon substrate 2 is exposed is removed by the anisotropic etching technique. Accordingly, the silicon oxide film 3 is exposed to thereby form the separation trench 9 and the substrate contact region 10. At this time, similarly to the above-mentioned embodiments, the slight inclination is given to the side wall of the substrate contact region 10 and the separation trench 9 so that the upper end of the opening on the surface side is larger than the bottom in which each silicon oxide film 3 is exposed.

Next, as shown in FIG. 22D, at a trench filling step S104, the TEOS oxide film 11 is deposited on the entire surface of the wafer 100 by the LPCVD method using the TEOS gas, and the separation trench 9 is perfectly filled.

Figure 23A:
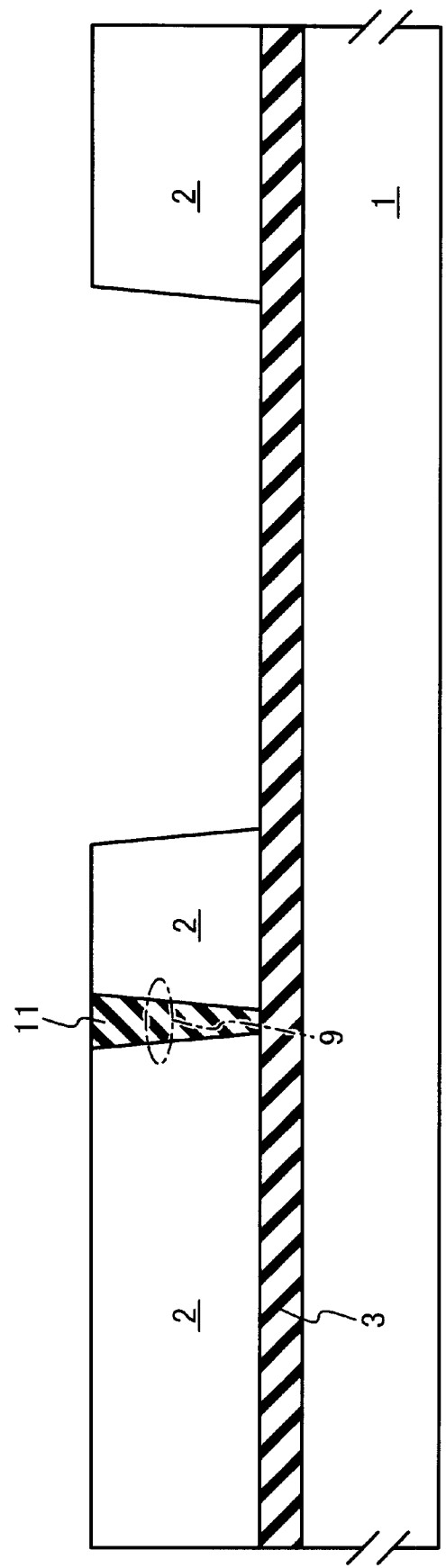

Next, as shown in FIG. 23A, at the mask layer removing step S105, the TEOS oxide film 11 deposited on the surface of the wafer 100 and the silicon oxide film 5 are etched back on the entire surface to accordingly expose the silicon substrate 2 of the element formation region 50.

Figure 23B:
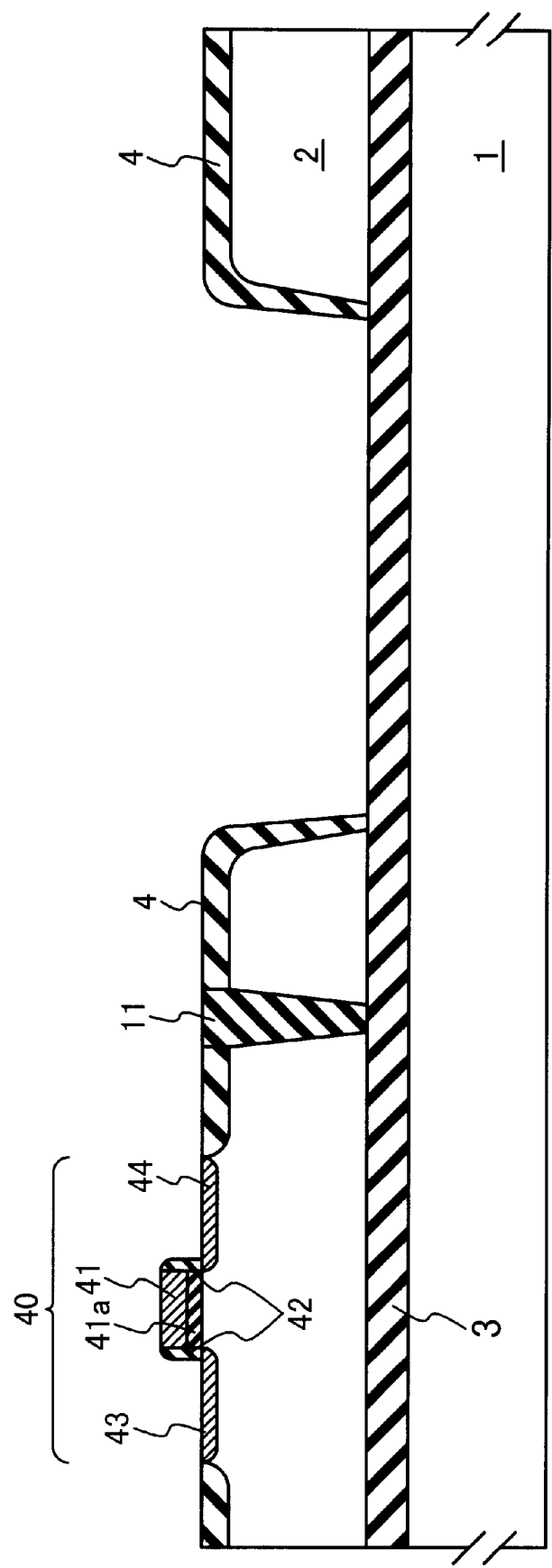

Next, as shown in FIG. 23B, at an element forming step S106, a field insulating film 4 and desirable elements are formed by use of a known method.

Figure 23C:
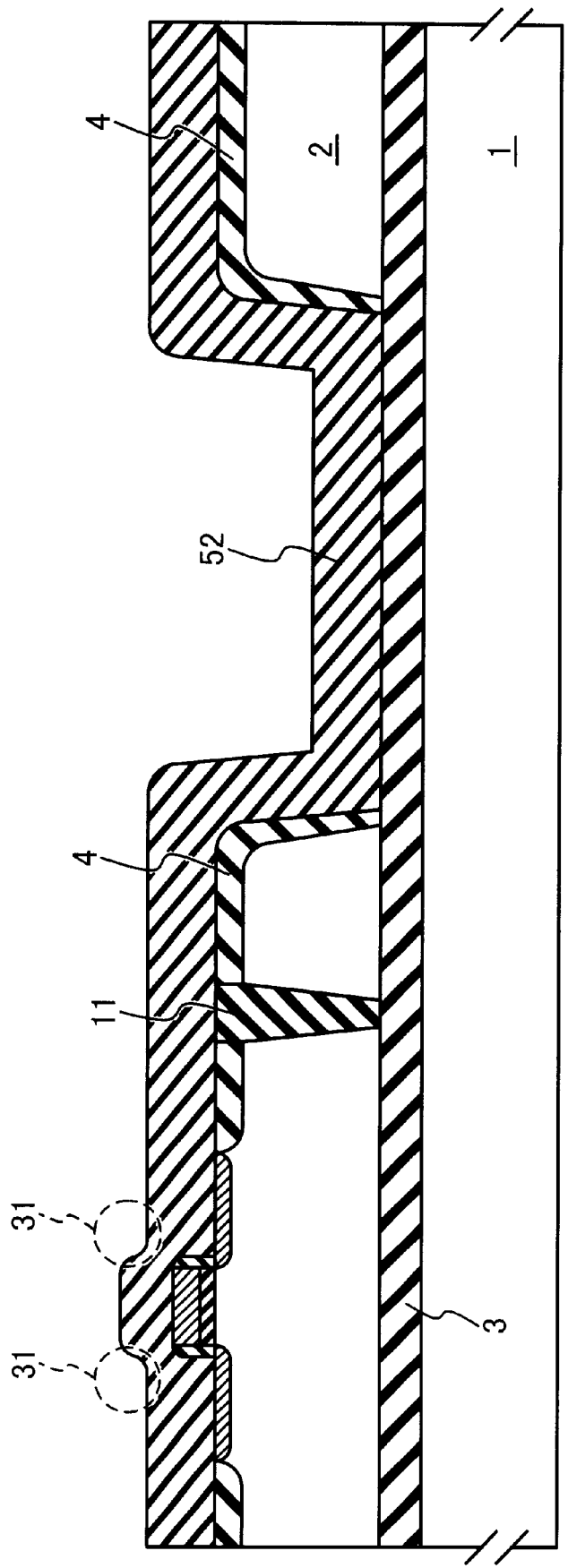

Next, as shown in FIG. 23C, at a flattening step S107, an silicon oxide film 52 is deposited with the thickness of about 1.5 μm on the surface of the wafer 100 by the CVD. Then, the silicon oxide film 52 is etched back on the entire surface to accordingly reduce a step difference 31 appearing in the element formation region 50.

Figure 24A:
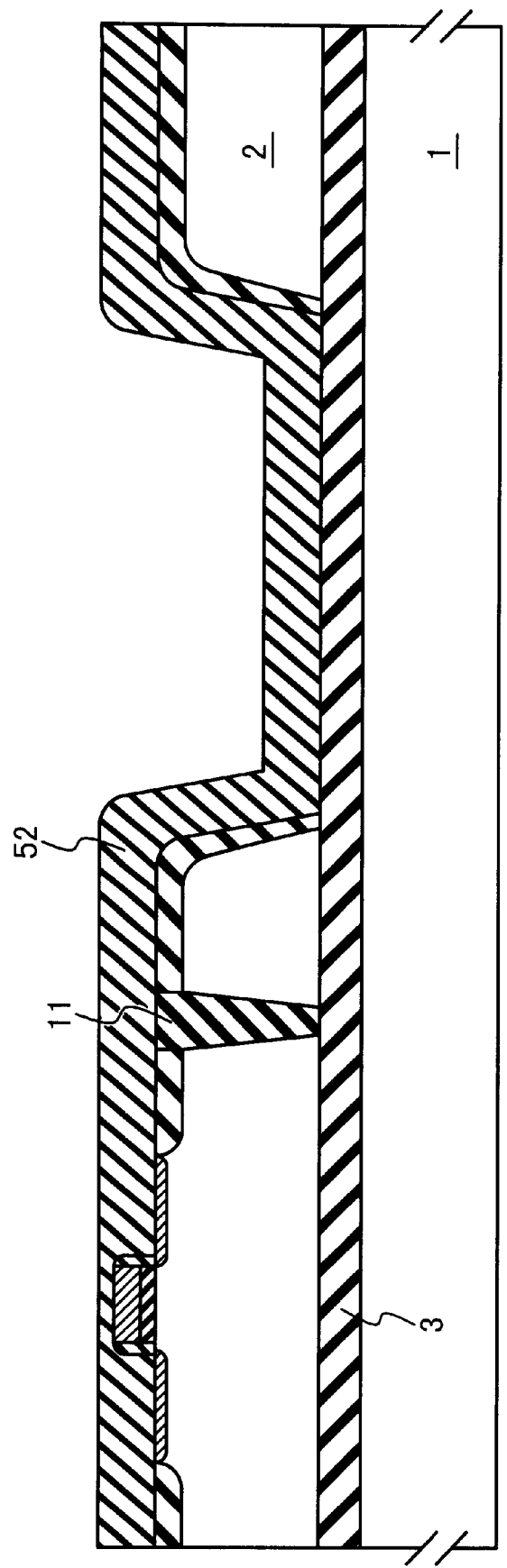
Figure 24B:
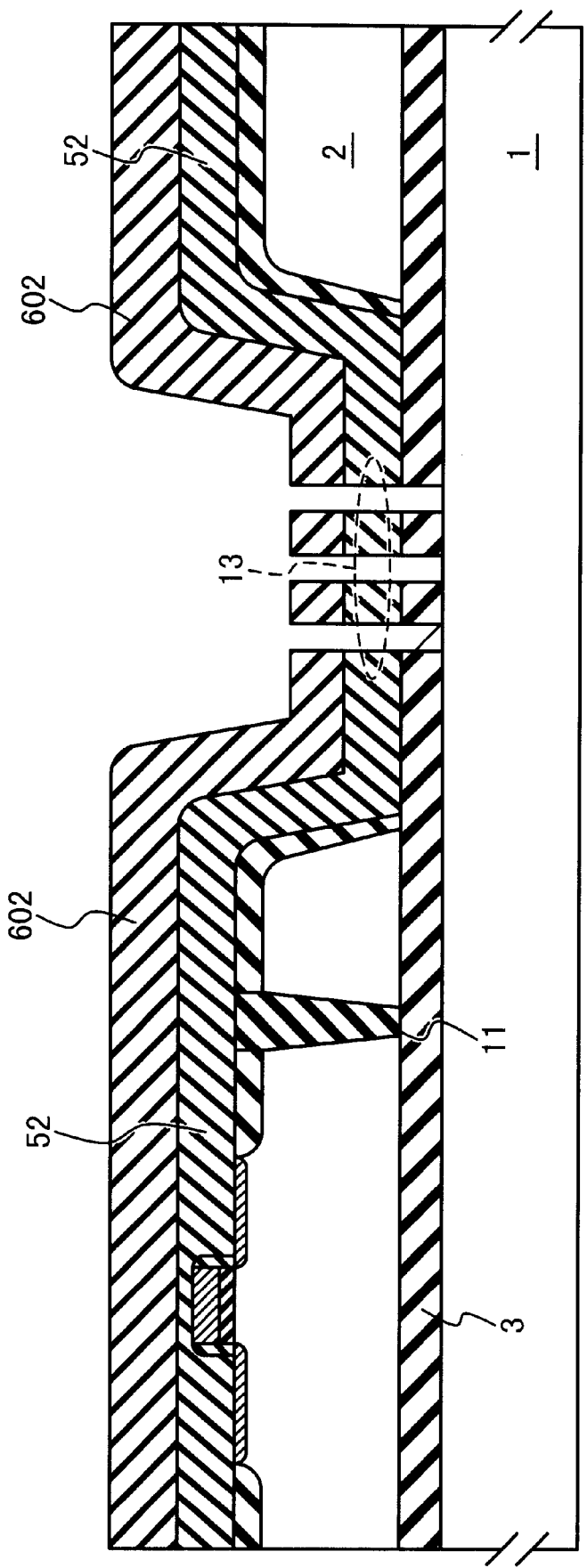
Figure 24C:
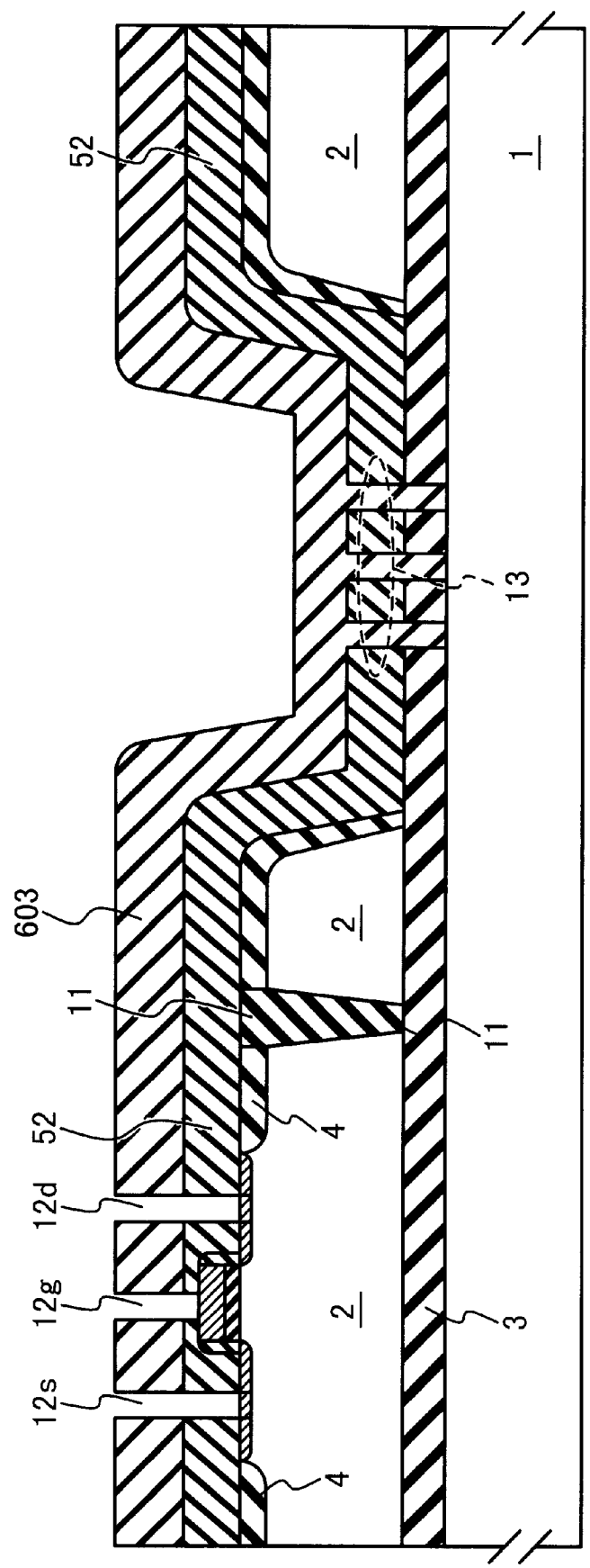

Next, as shown in FIG. 24A, a contact step S108 is carried out. When the first and second contact holes are formed, the insulating films are (the TEOS oxide film 11+the silicon oxide film 3) and (the TEOS oxide film 11+the silicon oxide film 5) in case where the elements are firstly formed, similarly to the above-mentioned embodiments. However, the insulating films are (the silicon oxide film 52+the silicon oxide film 3) and the silicon oxide film 52 in case where the separation trench is firstly formed. The other processes are similar to those of the above-mentioned embodiments. As a result, the detailed description is omitted. Also, the operations on and after the plug forming step S109 are perfectly similar to those of the above-mentioned embodiments. Thus, the sectional views for the respective steps and the detailed description are omitted. By way of precaution, the sectional view after the plug forming step S109 is shown in FIG. 24D. This corresponds to FIG. 11E of the above-mentioned embodiments.

As mentioned above, in the semiconductor device according to the present invention, the route to the support substrate from the external connection electrode on the surface of the chip, including the fill material of the contact hole, is perfectly made of the metal film. Thus, the entire resistance of the route can be sufficiently small to thereby stabilize the potential of the support substrate. Moreover, in the manufacturing method, the separation trench and the substrate contact region are formed at the same time. When the separation trench is filled with the insulator, the substrate contact region is designed so as not to be filled. Therefore, only the opening process is merely added for opening the first contact hole connected to the support substrate. Thus, the semiconductor device can be easily manufactured without any substantial step addition.

What is claimed is:

1. A semiconductor device comprising:

a conductive semiconductor substrate laminated or bonded on a conductive support substrate through a first insulating film;

a separation trench which separates a device formation region where at least a desired element is formed, from a region of said semiconductor substrate;

a substrate contact region where said semiconductor substrate is not present;

a second insulating film which fills said separation trench and covers a surface of said substrate contact region;

an external connection electrode formed above said semiconductor substrate; and a support substrate connecting section which passes through said first insulating film and said second insulating film in said substrate contact region to connect said external connection electrode and said support substrate.

2. The semiconductor device according to claim 1, wherein said external connection electrode is formed through a third insulating film on said semiconductor substrate.

3. The semiconductor device according to claim 2, wherein said third insulating film is identical to said second insulating film.

4. The semiconductor device according to claim 1, wherein said support substrate connecting section comprises a conductive film which is connected with said external connection electrode and covers said second insulating film; and a contact section which passes through said first insulating film and said second insulating film to said support substrate in said substrate contact region.

5. The semiconductor device according to claim 4, wherein said conductive film contains a metal film having aluminum as main material.

6. The semiconductor device according to claim 4, wherein said contact section is formed of a single contact.

7. The semiconductor device according to claim 6, wherein said single contact comprises:

a refractory metal film formed on side wall of a contact hole for said contact; and said conductive film filling said contact hole in which said refractory metal film is formed.

8. The semiconductor device according to claim 6, wherein said single contact comprises:

an additional conductive film which covers side wall of a contact hole for said contact;

a refractory metal film formed on said additional conductive film on said side wall of said contact hole; and said conductive film filling said contact hole in which said refractory metal film is formed.

9. The semiconductor device according to claim 4, wherein said contact section comprises:

a plurality of contact plugs arranged in an array.

10. The semiconductor device according to claim 9, wherein said plurality of contact plugs are formed of tungsten.

* * * * *